(12) United States Patent
Okabe et al.

(10) Patent No.: US 6,603,173 B1
(45) Date of Patent: Aug. 5, 2003

(54) VERTICAL TYPE MOSFET

(75) Inventors: Yoshifumi Okabe, Anjo (JP); Yoshihiko Ozeki, Kariya (JP); Shigeki Takahashi, Okazaki (JP); Norihito Tokura, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/391,236

(22) Filed: Sep. 7, 1999

Related U.S. Application Data

(63) Continuation-in-part of application No. 08/515,176, filed on Aug. 15, 1995, now Pat. No. 6,015,737, which is a continuation-in-part of application No. 08/413,410, filed on Mar. 30, 1995, now Pat. No. 5,776,812, and a continuation-in-part of application No. 08/030,338, filed as application No. PCT/JP92/00929 on Jul. 22, 1992, now Pat. No. 5,460,985.

(30) Foreign Application Priority Data

Jul. 26, 1991 (JP) .............................. 3-187602
Mar. 31, 1994 (JP) .............................. 6-62448
Sep. 24, 1998 (JP) .......................... 10-269961

(51) Int. Cl.$^7$ .......................... H01L 29/76; H01L 29/94
(52) U.S. Cl. ...................................... 257/330; 257/331
(58) Field of Search ........................... 257/328, 329, 257/330, 331

(56) References Cited

U.S. PATENT DOCUMENTS

| | | | |
|---|---|---|---|
| 3,901,737 A | 8/1975 | Dash .......................... 438/421 |
| 4,148,047 A | 4/1979 | Hendrickson ............... 257/332 |
| 4,217,599 A | 8/1980 | Sato et al. ................... 257/327 |
| 4,261,761 A | 4/1981 | Sato et al. ................... 438/270 |
| 4,364,073 A | 12/1982 | Becke et al. ................ 257/142 |
| 4,399,449 A | 8/1983 | Herman et al. .............. 257/490 |
| 4,412,378 A | 11/1983 | Shinada ....................... 438/370 |
| 4,503,449 A | 3/1985 | David et al. ................. 257/330 |
| 4,507,849 A | 4/1985 | Shinozaki .................... 438/430 |
| 4,561,003 A | 12/1985 | Tihanyi et al. ............... 257/341 |

(List continued on next page.)

FOREIGN PATENT DOCUMENTS

| | | | |
|---|---|---|---|
| DE | 3427293 A1 | 2/1985 | .................. 257/330 |
| DE | 4300806 C1 | 12/1993 | .................. 438/270 |
| EP | 0 345 380 | 12/1989 | .................. 257/330 |

(List continued on next page.)

OTHER PUBLICATIONS

Elie S. Ammar, et al., "UMOS Transistor on (110) Silicon", IEEE Transactions on Electron Devices, vol. ED–27, May, 1980, pp. 907–914.

Stanley Wolf, et al., Silicon Processing for the VLSI ERA, vol. 1: Press Technology, 1986, pp. 539–583.

Gill, "A Simple Technique for Monitoring Undercutting in Plasma Etching", Solid–State Electronics, vol. 23, 1980, p. 995.

(List continued on next page.)

*Primary Examiner*—Steven Loke
(74) *Attorney, Agent, or Firm*—Harness, Dickey & Pierce, PLC

(57) ABSTRACT

A vertical power MOSFET, which can improve a surge withstand voltage and a surge withstand voltage against a surge voltage from an inductance load L. The vertical power MOSFET has a plurality of unit cells. The unit cell is formed from a MOSFET that uses a p-type base layer at a sidewall of a rectangular U-groove as a channel portion. Each of the p-type base layer of each unit cell is connected each others Accordingly, it can restrain an impurity concentration of a corner portion (a portion positioned at a corner) of the rectangular p-type base layer from being decreased. Therefore, it can reduce the difference in distance from the end portion of the p-type base layer to the end portion of the depletion layer. As a result, it can improve the surge withstand voltage when a surge voltage is input from an inductance load L.

23 Claims, 20 Drawing Sheets

U.S. PATENT DOCUMENTS

| | | | |
|---|---|---|---|
| 4,823,176 A | 4/1989 | Baliga et al. | 257/335 |
| 4,824,795 A | 4/1989 | Blanchard | 438/413 |
| 4,879,254 A | 11/1989 | Tsuzuki et al. | 438/273 |
| 4,959,699 A | 9/1990 | Lidow et al. | 257/328 |
| 4,992,390 A | 2/1991 | Chang | 438/270 |
| 5,378,655 A | 1/1995 | Hutchings et al. | 438/138 |
| 5,385,852 A | 1/1995 | Oppermann et al. | 438/270 |
| 5,396,097 A | 3/1995 | Robb et al. | 257/341 |
| 5,399,515 A | 3/1995 | Davis et al. | 438/270 |
| 5,460,985 A | 10/1995 | Tokura et al. | 438/271 |
| 5,470,770 A | 11/1995 | Takahashi et al. | 438/297 |
| 5,532,179 A | 7/1996 | Chang et al. | 438/270 |
| 5,621,234 A | 4/1997 | Kato | 257/339 |
| 5,776,812 A | 7/1998 | Takahashi et al. | 438/268 |
| 6,057,558 A * | 5/2000 | Yamamoto et al. | 257/330 |
| 6,060,747 A * | 5/2000 | Okumura et al. | 257/331 |
| 6,316,300 B1 * | 11/2001 | Ozeki et al. | 438/197 |
| 6,476,443 B1 * | 11/2002 | Kinzer | 257/330 |

FOREIGN PATENT DOCUMENTS

| | | | |
|---|---|---|---|
| EP | 0 550 770 A1 | 7/1993 | 438/271 |
| EP | 091079 | 10/1993 | 257/330 |
| FR | 2 513 016 | 3/1983 | 257/330 |
| JP | 53-16581 | 2/1978 | 257/330 |
| JP | 54-91187 | 7/1979 | 257/327 |
| JP | 54-146584 | 11/1979 | 257/332 |
| JP | 55-48968 | 4/1980 | 257/330 |
| JP | 56-96865 | 8/1981 | 257/330 |
| JP | 56-150870 | 11/1981 | 257/142 |
| JP | 57-18365 | 1/1982 | 438/427 |
| JP | 58-58771 | 4/1983 | 257/330 |
| JP | 58-93275 | 6/1983 | 257/352 |
| JP | 58-166759 | 10/1983 | 438/445 |
| JP | 58-215053 | 12/1983 | 257/301 |
| JP | 59-8374 | 1/1984 | 257/330 |
| JP | 59-8375 | 1/1984 | 257/330 |
| JP | 59-008375 | 1/1984 | 257/330 |
| JP | 60-28271 | 2/1985 | 257/330 |
| JP | 60-175457 | 9/1985 | 438/FOR 424 |
| JP | 61-141151 | 6/1986 | 257/330 |
| JP | 61-199666 | 9/1986 | 257/627 |
| JP | 62-12167 * | 1/1987 | 257/330 |
| JP | 62-46569 | 2/1987 | 257/328 |
| JP | 62-150780 | 7/1987 | 257/342 |
| JP | 63-94687 | 4/1988 | 438/158 |
| JP | 63-250852 | 10/1988 | 257/627 |
| JP | 63-254769 | 10/1988 | 257/259 |
| JP | 63-266882 | 11/1988 | 257/330 |
| JP | 1-189172 | 7/1989 | 257/330 |
| JP | 1-192174 | 8/1989 | 257/331 |
| JP | 1-310576 | 12/1989 | 257/330 |
| JP | 2-86136 | 3/1990 | 438/305 |
| JP | 2-86171 | 3/1990 | 257/342 |
| JP | 2-262375 | 10/1990 | 257/330 |
| JP | 3-152976 | 6/1991 | 257/622 |
| JP | 4-58532 | 2/1992 | 438/763 |
| JP | 4-92473 | 3/1992 | 257/401 |
| JP | A-6-350090 | 12/1994 | 257/330 |
| JP | 7-273327 | 10/1995 | 257/330 |
| JP | 8-34312 | 3/1996 | 257/330 |
| JP | 8-298322 | 11/1996 | 257/330 |
| JP | A-9-45902 | 2/1997 | 257/330 |
| JP | 9-45902 | 2/1997 | 257/330 |
| JP | 2841865 | 10/1998 | 257/330 |
| JP | 2870472 | 1/1999 | 257/330 |
| WO | 93/03502 | 2/1993 | 257/330 |

OTHER PUBLICATIONS

Lee, et al., "Silicon Doping Effects in Reactive Plasma Etching" Journal of Vacuum Science & Technology B4(2), Mar./Apr. 1986, pp. 468–475.

Hideo Sakai, et al., "Methods to Improve the Surface Planarity of Locally Oxidized Silicon Devices", J. Electrochem. Soc.: Solid–State Science & Technology, Feb. 1997, pp. 318–320.

Ueda, et al., "A New Vertical Power MOSFET Structure with Extremely Reduced On–Resistance", IEEE Transactions of Electron Devices, vol. Ed–32, No. 1, Jan.

Sze, VSLI Technology, 2nd Ed., 1988, pp. 100–110.

Nikkei Electronics No. 395, May, 1986, pp. 165–188. (See Appln. p. 1).

Tokura et al, "Concave–DMOSFET: A New Super Low On–Resistance Power MOSFET", Japan Society of Applied Physics, Aug. 1994, pp. 763–765.

"Solid State Devices and Materials", Japanese Journal of Applied Physics, Feb. 1995, vol. 34, No. 2B, pp. 903–908.

Williams, et al., "Proceedings of the $5^{th}$ International Symposium on Power Semiconductor Devices and Ics, ISPSO '93" IEEE, May 1993, pp. 135–140.

"Developing Power MOSFET of 50m", Nikkei Electronics, 19994, No. 616, pp. 15–16.

Kishino and Koyanagi, "Physics of VLSI Device", Jul. 1986, p. 145.

Tokura, et al., "The DMOS Consisting of ChannelRegion Defines by LOCOS Power MOSFET", IEEE, May 1993, pp. 135–140.

Office Action dated Jun. 11, 2002 in corresponding Japanese Application No. 10–269961 (English translation attached).

* cited by examiner

VERTICAL TYPE MOSFET

CROSS REFERENCE TO RELATED APPLICATIONS

This is a continuation-in-part application of U.S. application Ser. No. 08/515,176 filed on Aug. 15, 1995, now U.S. Pat. No. 6,015,737, which is a continuation-in-part application of U.S. application Ser. No. 08/413,410 filed on Mar. 30, 1995, now U.S. Pat. No. 5,776,812 and U.S. application Ser. No. 08/030,338 filed on Mar. 25, 1993, now U.S. Pat. No. 5,460,985, which is a national phase application of Patent Cooperation Treaty Application PCT/JP92/00929 filed on Jul. 22, 1992 and claiming priority of the Japanese National Patent Application Nos. Hei. 3-187602 filed on Jul. 26, 1991 and Hei. 6-62448 filed on Mar. 31, 1994, and Hei. 10-269961 filed on Sep. 24, 1998, the contents of which are incorporated herein by reference.

BACKGROUND OF THE INVENTION

1. Technical Field

The present invention relates to a semiconductor device to be used as an electric power semiconductor device, especially to a vertical type MOSFET (Metal Oxide Semiconductor Field Effect Transistor), which is preferable in the case of adoption as MOSIC and the like in which an elemental article thereof or the semiconductor device fore electric power is incorporated.

2. Background Art

The vertical type power MOSFET has many features such that it has excellent frequency characteristics, has a fast switching velocity, can be driven at low electric power and the like, so that it has recently been used in many industrial fields. For example, in "Nikkei Electronics" published by Nikkei-McGraw-Hill, Inc. on May 19, 1986, pp. 165–188, it is described that the focus of development of the power MOSFET is in migrating to low voltage resistant articles and high voltage resistant articles. Further, it is described in this literature that the ON-resistance of a power MOSFET chip having a voltage resistance not more than 100 V has become low up to a level of 10 mΩ, and it is described as a reason thereof that the channel width per area has been able to be made large by utilizing the fine processing of LSI in the production of the power MOSFET, or by improving the shape of its cell. In addition, in this literature, the description is made using the vertical type power MOSFET as a main topic in which a DMOS type (double diffusion type) cell which is in the main current is used. The reason is that the DMOS type is fabricated by the planar process characterized in that the flat main surface of a silicon wafer is exactly used for a channel portion, so that it has advantages in production of a good yield and a cheap cost.

On the other hand, in accordance with popularization of the vertical type power MOSFET, the realization of low loss and low cost is further demanded, however, the reduction in the ON-resistance by the fine processing or the improvement in the shape of the cell has arrived at the limit. For example, according to the official gazette of Japanese Patent Application Laid-open No. Sho 63-266882 (1988), it has been known that the DMOS type has a local minimum point in which the ON-resistance does not further decrease even when the size of the unit cell is made small by fine processing, and a major cause thereof is the increase in the JFET resistance which constitutes, a component of the ON-resistance. In addition, with respect to the DMOS type, as shown in the official gazette of Japanese Patent Application Laid-open No. Hei 2-86136 (1990), the size of the unit cell with which the ON-resistance provides the local minimum point is in the vicinity of 15 μm under the present fine processing technique.

In order to break through this limit, various structures have been proposed. The common feature among them is a structure in which a groove is formed on the device surface, and channel portions are formed at side faces of the groove, and owing to this structure, the above-mentioned JFET resistance can be greatly decreased. Further, in the structure in which the channel portions are formed at the side faces of the groove, the increase in the JFET resistance can be neglected even when the unit cell size is made small, so that there is no limit that the ON-resistance provides the local minimum point with respect to the reduction in the unit cell size as described in the official gazette of Japanese Patent Application Laid-open No. Sho 63-266882 (1988), and it can be made small to the limit of the fine processing breaking through 15 μm.

The structure, in which the channel portions are formed at the side faces of the groove, is called the R (Rectangular)-MOS device or the U (U-shaped)-MOS device according to its shape. The structure shown in the official gazette of Japanese Patent Application Laid-open No. Sho 59-8374 (1984) is an example of the R-MOS device, which is a structure alternatively called the trench gate type in which a vertical groove is formed at the device surface by means of the anisotropic dry etching method, and channels and a gate are formed at sidewall portions of this groove, and this can completely extinguish the JFET resistance component. On the other hand, the structure shown in the official gazette of Japanese Patent Application Laid-open No. Hei 2-86171 (1990) is an example of the U-MOS in which the anisotropic wet etching of silicon or the LOCOS oxidation (Local Oxidation of Silicon) method is used as a method for processing the channel portion into the U-groove shape, and this can also greatly reduce the JFET resistance component.

Typical conventional examples of the vertical type power MOSFET in which the channel portions are formed at the side faces of the groove are shown in FIG. 14 (R-MOS) and FIG. 15 (U-MOS).

At first, the R-MOS device shown in FIG. 14 will be explained. In this vertical type power MOSFET, at the surface layer portion of an epitaxial layer 2 comprising an n⁻-type layer provided on a main face of a semiconductor substrate 1 comprising an n⁺-type silicon, a p-type diffusion layer and an n⁺-type diffusion layer are successively formed by ion implantation and thermal diffusion. Next, in order to allow parts of these p-type diffusion layer and n⁺-type diffusion layer to remain as a p-type base layer 16 and an n⁺-type source layer 4 respectively, the reactive ion etching method is used to perform etching until penetration though the p-type diffusion layer in the vertical direction with respect to the silicon substrate is achieved, so as to form a trench groove 50. A gate oxide film 8 is formed on an inner wall 51 of this trench groove 50, on which a gate electrode 9 is formed. Thus channels 5 are formed at sidewall portions of the inner wall 51, and the channel length is determined by a thickness of the p-type base layer 16. The ohmic contact is made for a source electrode 19 with the n⁺-type source layer 4, and for a drain electrode 20 with the back face of the semiconductor substrate 1, respectively.

In this R-MOS device, the ON-resistance between the drain and the source thereof is approximately the same as a sum of a channel resistance and a resistance of the n⁻-type drain layer 6, in which there is no JFET resistance which has been a problem in the above-mentioned DMOS type.

Therefore, the ON-resistance monotonically decreases in accordance with the reduction in the unit cell size a", the reduction can be made up to 5 to 6 μm which is the limit in the present fine processing, and the ON-resistance per area can be greatly reduced as compared with the DMOS type.

However, the R-MOS device has drawbacks in that the yield and the reliability are low. The cause is that the trench groove 50 is formed by the reactive ion etching method, and therefore the flatness of the sidewall surface of the inner wall 51 is bad and produces many defects, and the film quality of the gate oxide film 8, which is formed by oxidizing the surface thereof, is bad. Insulation inferiority of the gate oxide film, a decrease in the mobility due to the defect of the interface of the channel portion, and a change in the threshold voltage also take place. As described above, the structure of the R-MOS device has the advantage of greatly reducing the ON-resistance per area, but there are problems of high cost resulting from the low yield, and a problem of difficulty to ensure the reliability due to the bad stability of the gate oxide film and the channel portion.

On the contrary, in the U-MOS device shown in FIG. 15, the anisotropic wet etching or the LOCOS oxidation method is used as the step for forming the U-groove instead of the reactive ion etching, so that the flatness of the sidewall surface is good, a U-groove 50 having an inner wall 51 with less defect can be formed, and so that the film quality of a gate oxide film 8 formed by oxidizing the surface thereof is also good. As a result, as no insulation inferiority occurs, the characteristics of the channel portion can be made stable and the like, and a vertical type power MOSFET having a high yield and reliability can be obtained.

Fabrication steps for this U-MOS device will be explained in accordance with FIG. 16 to FIG. 19 and FIG. 15. In this vertical type power MOSFET, as shown in FIG. 16, using a mask of an insulation film 22 partially formed with a unit cell size a' of a cell on the main surface of a wafer 21 provided with an epitaxial layer 2 comprising an n⁻-type layer provided on a main face of a semiconductor substrate 1 comprising n⁺-type silicon, boron is doubly diffused by selective ion implantation and thermal diffusion, so as to form a p-type diffusion layer 23 and a p⁺-type contact region 17. Next, after removing the insulation film 22, as shown in FIG. 17, using a mask of an insulation film 24 partially formed on the main surface of the wafer 21, phosphorus is diffused so as to form an n⁺-type diffusion layer 25 to overlap over p-type diffusion layers 23 of adjacent cells 15.

Next, after removing the insulation film 24, as shown in FIG. 18, using a mask of an insulation film 26 partially formed on the main surface of the wafer 21, the U-groove 50 is formed by the anisotropic etching or the LOCOS oxidation method. By the formation of this U-groove 50, peripheral edge portions of the adjacent p-type diffusion layers 23 and the central portion of the n⁺-type diffusion layer 25 are removed, so as to form a p-type base layer 16 and an n⁺-type source layer 4 separated by the U-groove 50 for every unit cell having a unit cell size of a'.

Next, after removing the insulation film 26, as shown in FIG. 19, a gate oxide film 8 is formed on the surface of the U-groove 50, and a gate electrode 9 comprising polysilicon is formed on this gate oxide film 8. Next, as shown in FIG. 15, an interlayer insulation film 18 is formed on the main surface of the wafer 21 so as to cover the gate oxide film 8 and the gate electrode 9, and the interlayer insulation film 18 is subjected to opening formation in order to expose parts of the p⁺-type base contact layer 17 and the n⁺-type source layer 4. A source electrode 19, which makes ohmic contact with the p⁺-type base contact layer 17 and the n⁺-type source layer 4, is formed on the main surface of the wafer 21. Further, a drain electrode 20 which makes ohmic contact with the back face of the semiconductor substrate 1 is formed, and the vertical type power MOSFET of the U-MOS structure is completed.

This U-MOS device shown in FIG. 15 has the feature that the yield and the reliability are high in a-degree equivalent to the DMOS type, which is extremely excellent in this point as compared with the R-MOS device. This is due to the fact that the U-groove 50 is formed by the wet etching of silicon or the LOCOS oxidation method, thereby the flatness of its inner wall 51 is good with less defect, and the film quality of the gate oxide film 8 formed by oxidizing the surface thereof is also good, and it becomes difficult to cause the insulation inferiority of the gate oxide film and the characteristic change of the channel portion.

The ON-resistance between the drain and the source of the U-MOS is approximately the same as a sum of a channel resistance and a resistance of the n⁻-type drain layer 6 in the same manner as the above-mentioned R-MOS, and the JFET resistance of a JFET portion 7 is sufficiently small. Thus, in the same manner as in the above-mentioned R-MOS device, the ON-resistance decreases monotonically in accordance with the reduction in the unit cell size a', however, it can be only made slightly smaller than about 15 μm of the DMOS type within the limit of the present fine processing, and cannot be made small into 5 to 6 μm of the R-MOS type. However, since the JFET resistance is sufficiently small, the ON-resistance per area is an intermediate value between those of the R-MOS type and the DMOS type. As described above, the U-MOS has a structure in which the feature of the low ON-resistance of the R-MOS is partially inherited while maintaining the high production yield and the high reliability of the DMOS.

In order to reduce the ON-resistance of the U-MOS to be equivalent to the R-MOS, it is necessary and indispensable to reduce the unit cell size a'. However, in the production method of the U-MOS shown in FIGS. 16 to 19 and FIG. 15, the reduction in the unit cell size a' is difficult. The reason thereof will be explained hereinafter.

At first, it will be explained in detail what determines the unit cell size of the U-MOS device.

In FIG. 15, the sizes of each of indicated portions have relations as follows.

$$a'=b'+2\alpha'$$
$$b'=c'+2\beta'$$
$$c'=d'+2\gamma'$$
$$d'=e'+2\delta' \qquad (1)$$

Wherein, a' is a unit cell size, b' is a distance between upper ends of two adjacent U-grooves, c' is a distance between adjacent gate electrodes, d' is a size of a contact hole, and e' is a size of a portion of the base contact layer 17 exposed to the surface. In addition, α' is a plane distance between the center and the upper end of the U-groove 50, β' is a plane distance between the upper end of the U-groove 50 and the end of the gate electrode 9, γ' is a plane distance between the end of the gate electrode 9 and the end of the contact hole, and δ' is a plane distance between the end of the contact hole and the end of the portion of the base contact layer 17 exposed to the surface.

In this case, in the present fine processing level, the adjustment accuracy of the mask is about 0.5 to 1 μm, and also considering the size accuracy in the etching processing and the like, each value in the above-mentioned formulae (1) takes, for example, the following value.

$$\beta'=1\ [\mu m],\ \gamma'=1.5\ [\mu m],\ \delta'=1\ [\mu m],\ b'=8.5\ [\mu m],\ c'=6.5\ [\mu m], \\ d'=3.5\ [\mu m],\ e'=1.5\ [\mu m] \quad (2)$$

According to the formulae (1) and (2), the unit cell size a' is $$a'=b'+2\alpha'=8.5+2\alpha'\ [\mu m] \quad (3)$$

wherein in order to reduce the unit cell size a', the value of the plane distance $\alpha'$ between the center and the upper end of the U-groove 50 is key.

According to FIGS. 16 to 18, it is understood that the size of $\alpha'$ is determined by the length of the bottom side and the processing accuracy of the U-groove 50, and the adjustment accuracy of the insulation film 26 (the mask for forming the U-groove) with respect to the p-type diffusion layer 23. FIG. 20 is a cross-sectional view of an important part including the U-groove 50 when a center line CL, between the two adjacent p-type diffusion layers 23 overlaps a center line $CL_2$ between the two adjacent insulation films 26, which corresponds to a case in which there is no mask deviation. In this case, $\alpha'$ is given by the following formula (4).

$$\alpha'=\alpha'1+\alpha'2+\alpha'3 \quad (4)$$

However, $\alpha'1$ is ½ of a length with which the bottom side portion of the U-groove 50 contacts with the n⁻-type drain layer 6, $\alpha'2$ is a length with which the bottom side portion of the U-groove 50 contacts with the p-type base layer 16, and $\alpha'3$ is a length of projection of the sidewall portion of the U-groove 50 onto the main surface of the wafer 21.

In this case, the right and left $\alpha'2$s are approximately equal in FIG. 20. However, in fact, due to the presence of the deviation of the mask adjustment, the right and left $\alpha'2$s are different, so that it is necessary that $\alpha'2$ in each of the items in the formula (4) is set to be about 1.5 $\mu$m. The reason thereof is that when the mask adjustment of the insulation film 26 is the worst, on account of mask adjustment accuracy possible under the present circumstances, as shown in FIG. 21, with respect to the center line $CL_1$ between the two adjacent p-type diffusion layers 23, the center line $CL_2$ between the two adjacent insulation films 26 generates a positional deviation (for example, 1 $\mu$m) in the right direction. In order to prevent an electric field concentration at the edge portion 12 so as to avoid the inconvenience resulting from a dielectric breakdown of the gate portion even when such positional deviation takes place, thus allowing the edge portion 12 at the groove bottom of the U-groove 50 not to be exposed to the n⁻-type drain layer 6 but to be positioned in the p-type base layer 16, it is necessary to make a design in which this positional deviation is taken into account. Therefore, the following formula (5) must be necessarily established with respect to lengths $\alpha'21$ and $\alpha'22$ with which the bottom side portions of the U-groove 50 contact with the p-type base layers 16.

$$0<\alpha'21,\ \alpha'22 \quad (5)$$

In addition, with respect to $\alpha'1$ and $\alpha'3$, both of them are about 0.75 $\mu$m in the present fine processing level, so that $\alpha'$ takes the following value according to the formula (4).

$$\alpha'=0.75+1.5+0.75=3\ [\mu m] \quad (6)$$

Therefore, according to the formulae (3) and (6), the minimum value of the unit cell size a' is $$a'=8.5+2\times3=14.5\ [\mu m]. \quad (7)$$

As described above, in the production method of the U-MOS shown in FIGS. 16 to 19 and FIG. 15, the reduction limit of the unit cell size a' is about 14.5 $\mu$m, which is approximately the same as 15 $\mu$m of the conventional DMOS type, and it has been difficult to significantly reduce the ON-resistance per area.

On the other hand, a power semiconductor element eliminating JFET portion to decrease ON-resistance has been shown in Japanese Patent Application Laid-open No. Sho 62-12167 (1987). This application especially shows a trench-gate type vertical type MOSFET or IGBT, which uses sidewalls of the trenches as channel portions.

FIGS. 35(a), 35(b) show the trench-gate type vertical type MOSFET of the above application. Here, FIG. 35(a) is a plan view illustrating a p-type base layer 203, which is shown by a hatching portion. FIG. 35(b) is a cross-sectional view taken along line 35(b)—35(b) in FIG. 35(a).

As shown in FIG. 35(a), the trench-gate type vertical type MOSFET includes an n⁻-type epitaxial layer 202, the p-type base layer 203 formed at a surface portion of the n⁻-type epitaxial layer 202. An n⁺-type source layer 204 having a junction depth shallower than that of the p-type base layer 203 is formed in the surface portion of the p-type base layer 203. On an inside surface of a trench 205 penetrating the n⁺-type source layer 204 and the p-type base layer 203, a gate electrode 207 is formed with a gate oxide film 206 interposed therebetween. One portion of the p-type base layer 203 positioned at the sidewall of the trench 205 between the n⁺-type source layer 204 and the n⁻-type epitaxial layer 202 is defined as a channel portion to perform a transistor operation.

A plurality of unit cells 200 including such as the trench-gate type vertical type MOSFET, which are formed to a rectangular shape, are arranged to matrix shape on a wafer. In this structure, each unit cell 200 has one p-type base layer 203, that is, the trenches are all connected to each other.

In more detail, one group of trenches and another group of trenches perpendicular to the one group are arranged to a matrix shape, and a plurality of unit cells are arranged at regions defined by adjacent trenches of the one group and adjacent trenches of the another group. Therefore, the adjacent p-type base layers 203 are not connected to each other, but rather are isolated by the trenches. Furthermore, each of the isolated p-type base layers 203 has the gate electrode 207.

In this case that the adjacent p-type base layers 203 are not connected, at a corner of the rectangular p-type base layers 203, an impurity concentration lowers because an amount of impurity diffusion is small at this region.

Therefore, a difference in distance in diagonal direction extending from an end of a depletion layer to an end of the p-type base layers 203 becomes large. Accordingly, a withstand voltage at a center portion between diagonally opposed adjacent p-type base layers 203 may be decreased, and a surge withstand voltage of this center portion, when a surge voltage is input when an inductance load L is connected, may also decrease.

SUMMARY OF INVENTION

It is an object of the present invention to provide a vertical type power MOSFET in which the ON-resistance can be made small.

It is another object of the present invention to provide a power semiconductor device, which can improve a surge withstand voltage and a surge withstand voltage against a surge voltage from an inductance load L.

In order to achieve the above-mentioned object, the production method of a vertical type power MOSFET according to the present invention is different from conventional methods, wherein substantial groove formation is performed beforehand before formation of a base layer and a source layer.

Namely, the production method of a vertical type MOSFET according to the present invention is characterized in that it comprises:

a local oxidation step which includes a step of preparing a semiconductor substrate, a step of forming a semiconductor layer of the first conductive type at one main face side of the semiconductor substrate, the semiconductor layer having an impurity concentration lower than that of the semiconductor substrate and using the surface of the semiconductor layer of the low concentration as a main surface, and a step of local oxidizing a predetermined region of the main surface, thereby a local oxide film having a predetermined depth from the main surface is formed in the semiconductor layer in the predetermined region, an impurity introduction step in which in order to form channels on the semiconductor layer surface contacting with a side face of the local oxide film, impurities of the second conductive type and the first conductive type are doubly diffused from the main surface successively in a manner of self-alignment with respect to the local oxide film, and the length of the channel is determined by the double diffusion, simultaneously with which a base layer of the second conductive type and a source layer of the first conductive type are formed, and remaining semiconductor layer is made into a drain layer of the first conductive type, a gate formation step in which the local oxide film is removed after the double diffusion to form a groove structure having the predetermined depth, an inner wall of the groove including a portion to become the channel is oxidized to provide a gate oxide film, and a gate electrode is formed on the gate oxide film, and a source and drain electrodes formation step in which a source electrode which electrically contacts with both the source layer and the base layer, and a drain electrode which electrically contacts with the other main face side of the semiconductor substrate are formed.

Namely, the base layer and the source layer are formed by double diffusion in a manner of self-alignment using the local oxide film as the mask for diffusion, simultaneously with which the channel region is set at the sidewall portion of the semiconductor layer subjected to erosion by the local oxide film. In addition, this local oxide film is removed in the following steps, which becomes the groove portion in which the gate electrode is established.

As described above, the channels are formed at the sidewall portions in the manner of self-alignment by the end face of the local oxide film, so that the channels of the adjacent cells formed at each of the sidewall portions of the grooves have an exactly symmetric structure. In addition, the base layer is diffused in the manner of self-alignment using the local oxide film as the mask, so that the base layer is subjected to the diffusion and formation with exact positional determination at the sidewall portion of the groove, and its conjugation depth can be exactly controlled.

Therefore, it is also possible to set a diffusion condition so as to allow the base layer to exactly wrap the edge portion of the groove bottom face.

As described above, the groove is formed by the local oxidation method, and the local oxide film is used as the mask to form the base layer, the source layer and the channel by the double diffusion in the manner of self-alignment, thereby the edge portion of the groove bottom side can be made into an exactly symmetric structure in each cell.

Therefore, it is unnecessary to form a U-groove having a sufficiently long bottom face to allow the edge portion to be positioned in the base layer even when the positional deviation of the U-groove with respect to the base layer end occurs as in the conventional U-MOS device, and the length of the bottom face of the U-groove can be made short into the necessary minimum. As a result, it is unnecessary to take the mask deviation into account, the unit cell size can be greatly reduced, and the ON-resistance per area can be reduced to be approximately the same as that of the R-MOS device. Moreover, the production yield and the reliability are high in a degree equivalent to the DMOS type.

In order to achieve one of the above-mentioned objects, a semiconductor device of the present invention employs a structure in which a unit cell uses a p-type base layer at a sidewall of a U-groove as a channel portion. The p-type base layers of a plurality of unit cells are connected to each other.

Accordingly, it can restrain an impurity concentration of a corner portion (a portion positioned at a corner) of the rectangular p-type base layer from being decreased. Therefore, it can reduce the difference in distance from the end portion of the p-type base layer to the end portion of the depletion layer. As a result, it can improve the surge withstand voltage when a surge voltage is input from an inductance load L.

DESCRIPTION OF PREFERRED EMBODIMENTS

Embodiments of the present invention will be explained hereinafter with reference to the drawings.

Figure 1A:
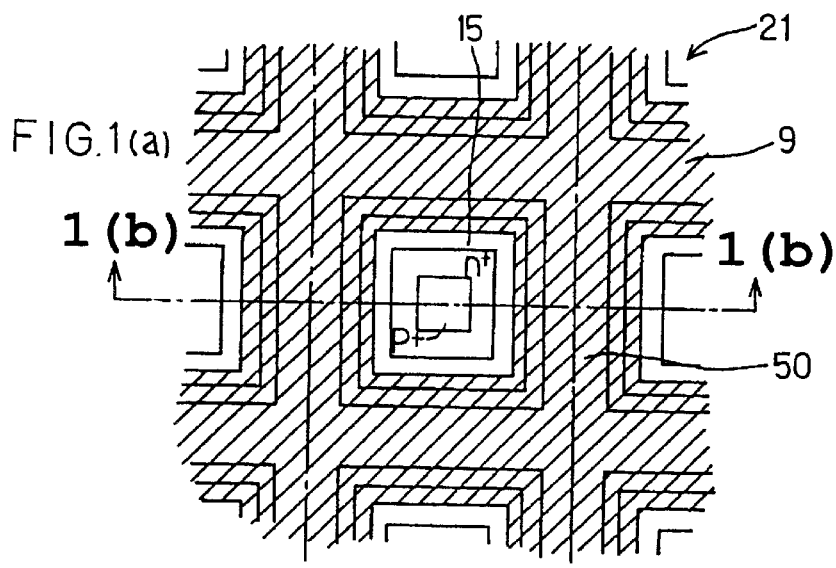
FIG. 1(a) is a plane view showing a part of a vertical type power MOSFET according to the first example of the present invention.
Figure 1B:
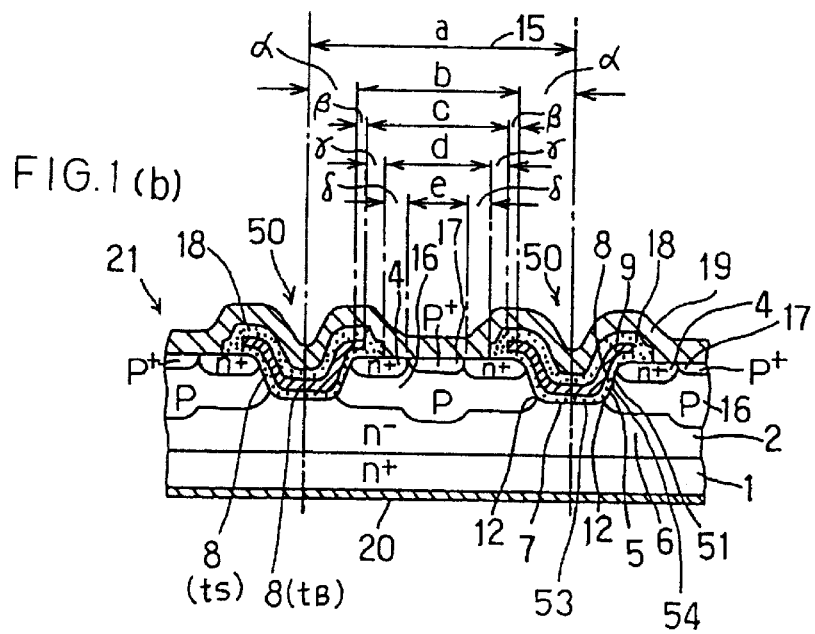
FIG. 1(b) is a cross-sectional view taken along line 1(b)—1(b) in FIG. 1(a)
Figure 2:
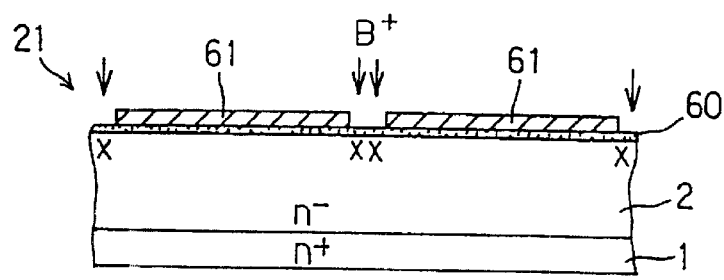
FIG. 2 through FIG. 13 are cross-sectional views of important parts to be used for the explanation of production steps of the vertical type power MOSFET according to the first example of the present invention.
Figure 3:
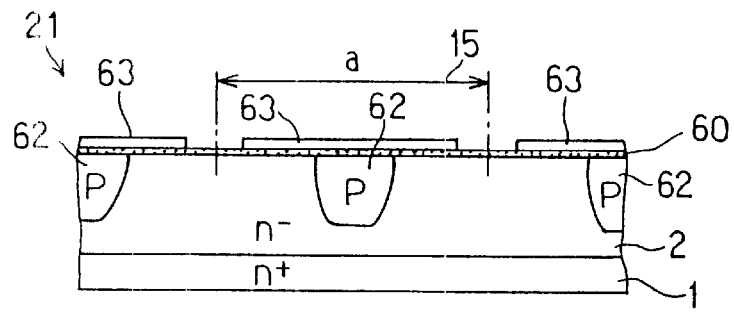
Figure 4:
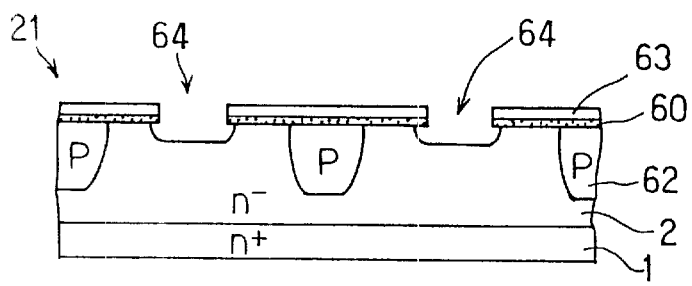
Figure 5:
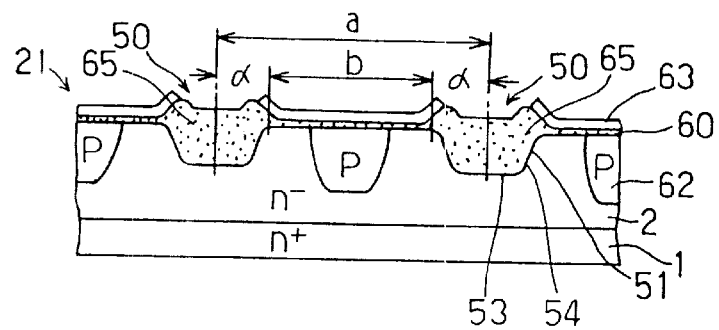
Figure 6:
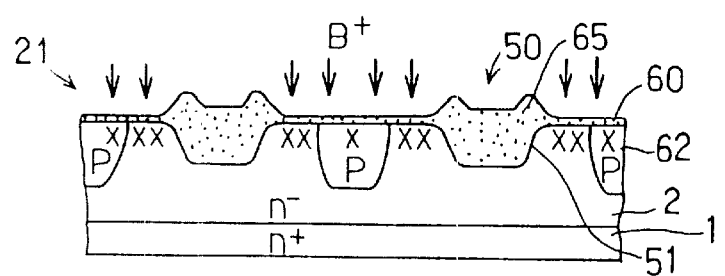
Figure 7:
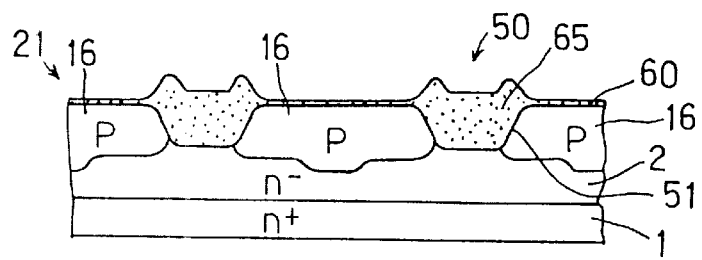
Figure 8:
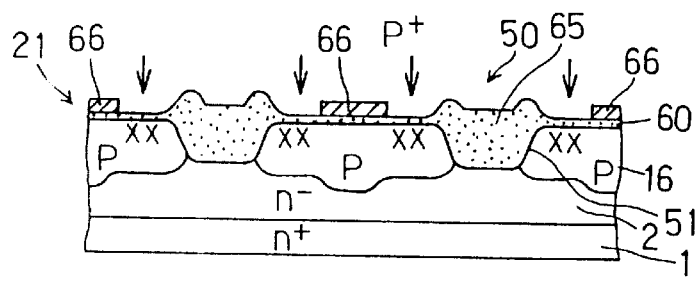
Figure 9:
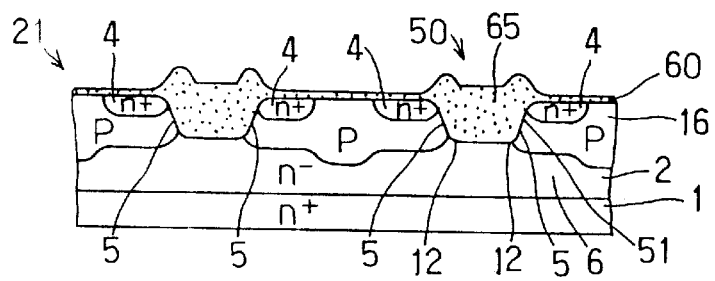
Figure 10:
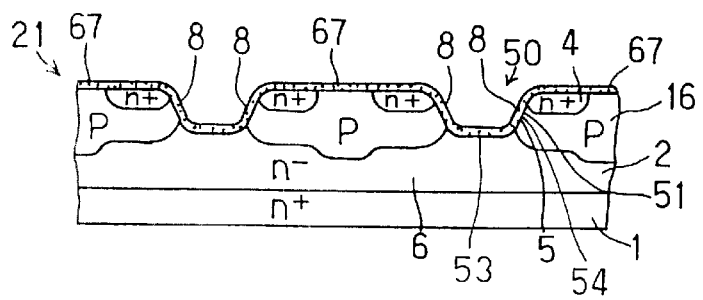
Figure 11:
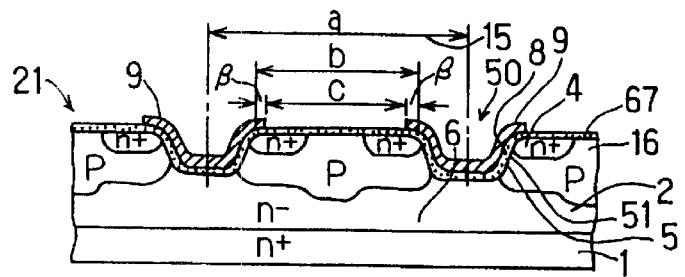
Figure 12:
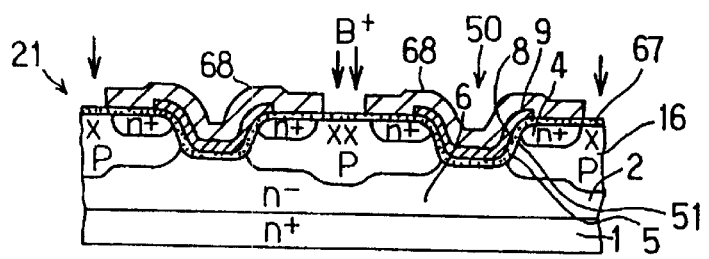
Figure 13:
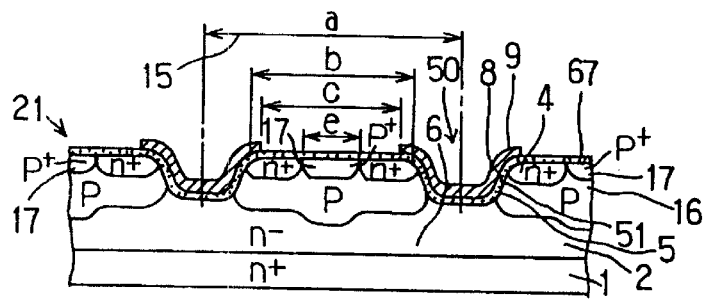

FIG. 1(a) is a plane view of a vertical power MOSFET comprising rectangular unit cells according to the first example of the present invention, and FIG. 1(b) is a cross-sectional view taken along 1(b)—1(b) in FIG. 1(a). FIG. 2 to FIG. 13 are also cross-sectional views of a wafer as each step progresses in the production of the vertical type power MOSFET, which corresponds to FIG. 1(b). Incidentally, FIG. 2 is a cross-sectional view of the wafer subjected to boron ion implantation for the formation of the central portion of a p-type base layer, FIG. 3 is a cross-sectional view of the wafer subjected to patterning of a silicon nitride film at an interval of a unit cell size a for the LOCOS oxidation, FIG. 4 is a cross-sectional view of the wafer in which a window of the silicon nitride film is subjected to wet etching, FIG. 5 is a cross-sectional view of the wafer in which a LOCOS oxide film is formed, FIG. 6 is a cross-sectional view of the wafer subjected to boron ion implantation for the formation of the p-type base layer using the LOCOS oxide film as a mask, FIG. 7 is a cross-sectional view of the wafer in which the p-type base layer is formed by thermal diffusion, FIG. 8 is a cross-sectional view of the wafer subjected to phosphorus ion implantation for the formation of an $n^+$-type source layer using the LOCOS oxide film as a mask, FIG. 9 is a cross-sectional view of the wafer in which the $n^+$-type source layer is formed by thermal diffusion, FIG. 10 is a cross-sectional view of the wafer in which a gate oxide film is formed by thermal oxidation after removing the LOCOS oxide film, FIG. 11 is a cross-sectional view of the wafer in which a gate electrode is formed on the gate oxide film, FIG. 12 is a cross-sectional view of the wafer subjected to boron ion implantation for the formation of a $p^+$-type base contact layer, FIG. 13 is a cross-sectional view of the wafer in which the $p^+$-type base contact layer is formed by thermal diffusion, and FIG. 1(b) is a completed cross-sectional view of the wafer in which an interlayer insulation film, a source electrode and a drain electrode are formed.

The vertical type power MOSFET unit cell portion of this example has as shown in FIG. 1(b) is now described. FIGS. 1(a) and 1(b) show a structure in which a large number of the unit cells 15 are regularly arranged vertically and laterally on a plane with a pitch width (unit cell size) a.

In FIGS. 1(a) and 1(b), a wafer 21 comprises a semiconductor substrate 1 and an $n^-$-type epitaxial layer 2 thereon. The semiconductor substrate 1 is constituted of $n^+$-type silicon having an impurity concentration of about $10^{20}$ cm$^{-3}$ and a thickness of 100 to 300 μm and the $n^-$-type epitaxial layer 2 has an impurity concentration of about $10^{16}$ cm$^{-3}$ and a thickness of about 7 μm. The unit cells 15 are constituted on the main surface of this wafer 21. In order to form a U-groove 50 on the main surface of the wafer 21 with a unit cell size a of about 12 μm, a LOCOS oxide film having a thickness of about 3 μm is formed, and using this oxide film as a mask, double diffusion in a manner of self-alignment is used to form a p-type base layer 16 having a junction depth of about 3 μm and an $n^+$-type source layer 4 having a junction depth of about 1 μm, thereby a channel 5 is set at a sidewall portion 51 of the U-groove 50. Incidentally, the junction depth of the p-type base layer 16 is set to be a depth with which no destruction occurs due to breakdown at an edge portion 12 of the bottom side of the U-groove 50. In addition, in order to allow the junction depth of the central portion of the p-type base layer 16 to be deeper than those of surroundings, boron is beforehand diffused at the central portion of the p-type base layer 16, so as to be set to allow the breakdown to occur at the central portion of the bottom face of the p-type base layer 16 when a high voltage is applied between the drain and the source.

In addition, after the double diffusion, the diffusion mask and the LOCOS oxide film used for the formation of the U-groove 50 are removed, a gate oxide film 8 having a thickness of about 60 nm is formed at the inner wall of the U-groove 50, and a gate electrode 9 comprising polysilicon having a thickness of about 400 nm and an interlayer insulation film 18 comprising BPSG having a thickness of about 1 μm are formed thereon. Further, at the surface of the central portion of the p-type base layer 16, a $p^+$-type base contact layer 17 having a junction depth of about 0.5 μm is formed, and a source electrode 19 formed on the interlayer insulation film 18 makes ohmic contact with the n+-type source layer 4 and the p+-type base contact layer 17 through the contact hole. In addition, a drain electrode 20 is formed to make ohmic contact with the back face of the semiconductor substrate 1.

Figure 15:
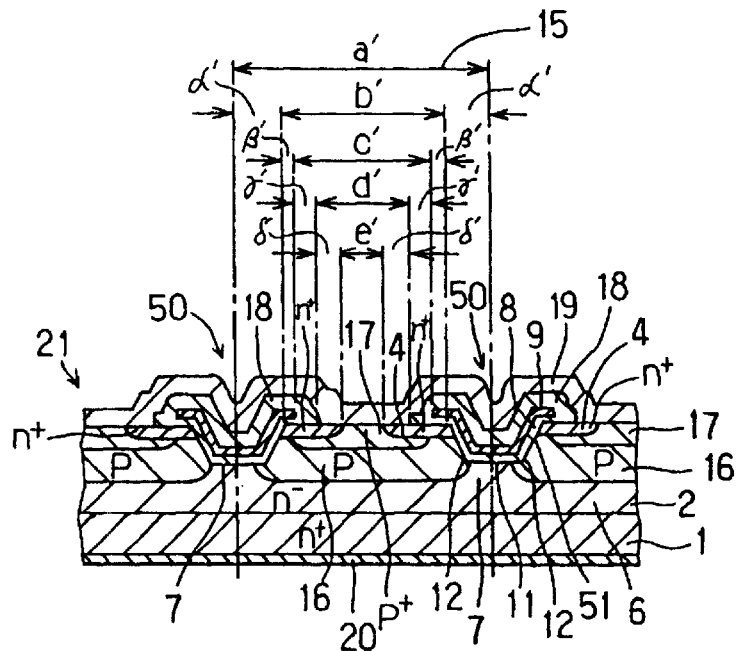
FIG. 15 is a cross-sectional view of a vertical type power MOSFET of the conventional U-MOS type.
Figure 16:
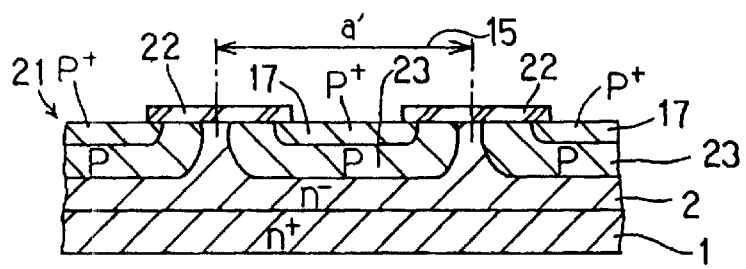
FIG. 16 through FIG. 19 are cross-sectional views of important parts to be used for the explanation of production steps of the vertical type power MOSFET of the conventional U-MOS type.
Figure 17:
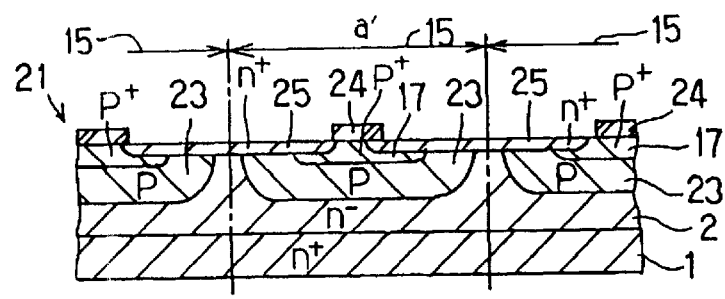
Figure 18:
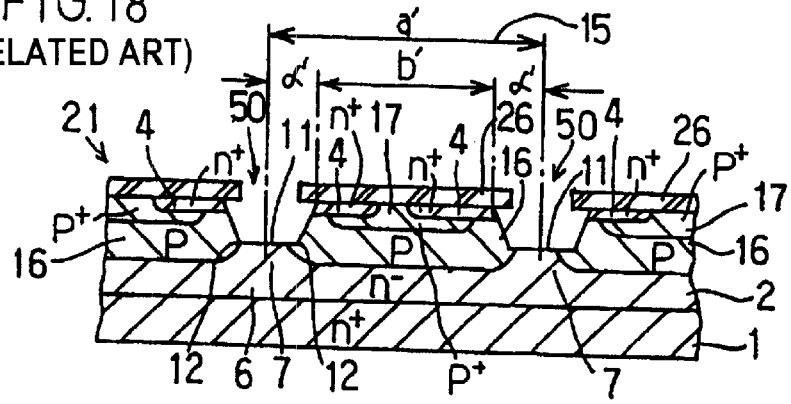
Figure 19:
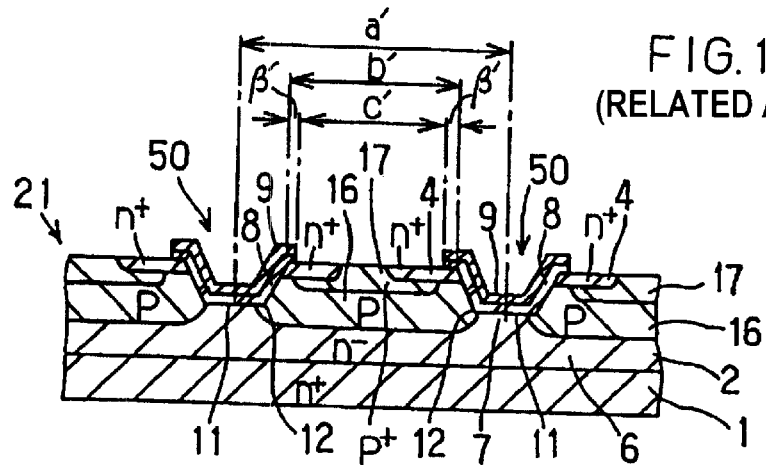

In the vertical type power MOSFET of the present example shown in FIGS. 1(a) and 1(b) and as explained above, the LOCOS oxide film is used as the mask to doubly diffuse the p-type base layer 16 and the n+-source layer 4 by self-alignment, so that it becomes unnecessary to take the adjustment accuracy of the mask into account, and in the above-mentioned formulae (1) to (7) established in the conventional U-MOS device shown in FIG. 15, the length $\alpha2'$ to contact with the p-type base layer 16 of the bottom side portion of the U-groove 50 can be neglected. Therefore, when each of the sizes other than $\alpha2'$ are numerical values as shown in the prior art and are used in the numerical formula 2, then in the present example, according to the formula (7), the plane distance a between the center and the upper end of the U-groove 50 can be reduced from 3 $\mu$m up to 1.5 $\mu$m.

Figure 14:
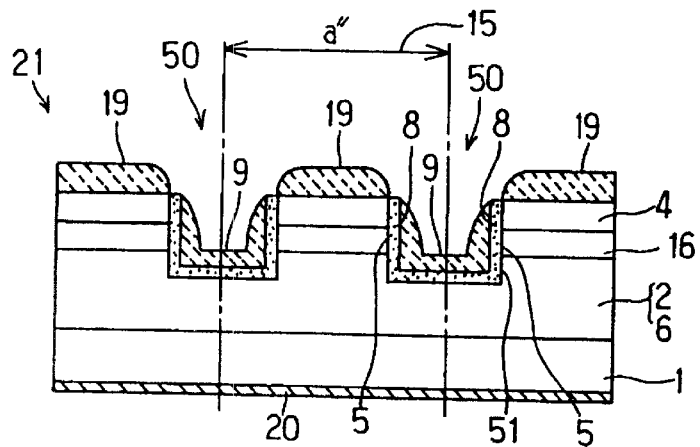
FIG. 14 is a cross-sectional view of a vertical type power MOSFET of the conventional R-MOS type.

As a result, the unit cell size a can be reduced up to 11.5 $\mu$m from 14.5 $\mu$m of the conventional U-MOS shown in FIG. 15, and the channel width.per area can be taken widely, to make it possible to reduce ON-resistance up to a value near the ON-resistance per area of the R-MOS device shown in FIG. 14.

Next, a production method of the vertical type power MOSFET according to the present invention will be explained.

At first, as shown in FIG. 2, a wafer 21, in which an n−-type epitaxial layer 2 is grown on the main surface of a semiconductor substrate 1 comprising n+-type silicon, is prepared. This semiconductor substrate 1 has its impurity concentration of about $10^{20}$ cm$^{-3}$. In addition, the epitaxial layer 2 has its thickness of about 7 $\mu$m and its impurity concentration of about $10^{16}$ cm$^{-3}$. The main surface of this wafer 21 is -thermally oxidized to form a field oxide film 60 having a thickness of about 60 nm, and then a photoresist film 61 is deposited to perform patterning of the photoresist film 61 into a pattern opening to the central portion of a planned position of cell formation by means of known optical lithography steps using this photoresist film 61 as a mask, ion implantation of boron (B+) is performed.

After peeling off the resist, a p-type diffusion layer 62 having a junction depth of about 3 $\mu$m is formed by thermal diffusion as shown in FIG. 3. This p-type diffusion layer 62 ultimately becomes a part of a p-type base layer 16 as -described hereinafter, and when a high voltage is applied between the drain and the source, the breakdown is allowed to occur stably at the bottom side portion of the p-type diffusion layer 62, thereby an object of the present invention to increase the surge resistance is achieved.

Next, as shown in FIG. 3, a silicon nitride film 63 is deposited on the main surface of the wafer 21 by about 200 nm, and this silicon-nitride film 63 is subjected to patterning to form an opening pattern of a lattice shape opening with a pitch width (size of the unit cell 15) a. Incidentally, this opening pattern is subjected to mask adjustment so as to allow the above-mentioned p-type diffusion layer 62 to be positioned at the central portion of its pitch interval.

Next, as shown in FIG. 4, the silicon nitride film 63 is used as a mask to etch the field oxide film 60, subsequently the n−-type epitaxial layer 2 is etched into a depth of about 1.5 $\mu$m to form a groove 64.

Next, as shown in FIG.5, the silicon nitride film 63 is used as a mask to thermally oxidize the portion of the groove 64. This is an oxidation method well-known as the LOCOS (Local Oxidation of Silicon), and a LOCOS oxide film 65 is formed by this oxidation, simultaneously with which a U-groove 50 is formed on the surface of the n−-type epitaxial layer 2 subjected to erosion by the LOCOS oxide film 65, and the shape of the groove 50 is decided. Namely, the distance b between upper ends of the adjacent U-grooves 50 is determined by a size of the silicon nitride film 63, which becomes slightly shorter due to side face oxidation by the so-called bird's beak. However, this reduction in the size is about 0.5 $\mu$m, and it can be controlled with a high accuracy. Incidentally, it is desirable that an inclination angle of the side face of the U-groove 50 with respect to the main surface of the wafer 21 is not less than 45°, which can be controlled by condition setting of the LOCOS oxidation or depth setting of the groove 64 formed prior to the LOCOS oxidation step.

Figure 20:
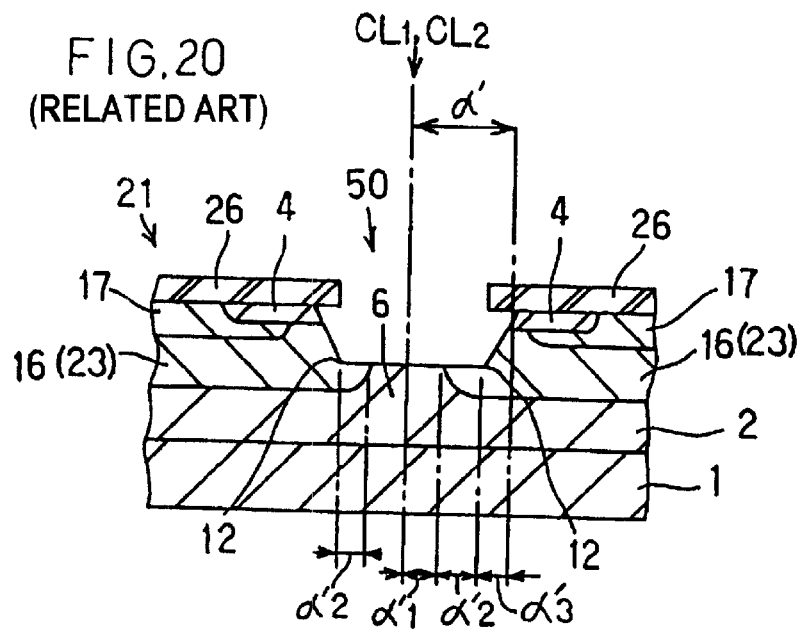
FIG. 20 is a cross-sectional view of an important part showing an ideal state in which the positional relation between an edge portion of a groove bottom face and a p-type base layer is in bilateral symmetry when the groove is formed in the production of the vertical type power MOSFET of the conventional U-MOS type.

As described hereinafter, the distance b between the upper ends of the adjacent U-grooves 50 is about 8.5 $\mu$m. In addition, in FIG. 5, the plane distance $\alpha$ between the center and the upper end of the U-groove 50 is given by the formula (8) in the same manner as the case of the conventional U-MOS device shown in FIG. 20 and the formula )4).

$$\alpha = \alpha1 + \alpha2 + \alpha3 \tag{8}$$

However, $\alpha1$ is ½ of a length to contact with the n−-type drain layer 6 of the bottom side portion of the U-groove 50, $\alpha2$ is a length to contact with the p-type base layer 16 of the bottom side portion of the U-groove 50, and $\alpha3$ is a length of projection of the sidewall portion of the U-groove 50 onto the main surface of the wafer 21.

However, $\alpha2$ in the formula (8) can be omitted as described hereinafter, so that the formula (8) can be rewritten into the following formula.

$$\alpha = \alpha1 + \alpha3 \tag{9}$$

Both $\alpha1$ and $\alpha3$ are about 0.75 $\mu$m in the processing technique in the present circumstance, so that a takes the following value.

$$\alpha = 1.5 \; [\mu m] \tag{10}$$

Incidentally, the inner wall surface of the U-groove 50 formed by the LOCOS oxidation is flat and has less defects, and the surface has a good surface state in a degree equivalent to the initial main surface of the wafer 21 shown in FIG. 2.

Next, as shown in FIG. 6, the LOCOS oxide film 65 is used as a mask to perform ion implantation of boron through the thin field oxide film 60 for forming the p-type base layer 16. At this time, the boundary portion between the LOCOS oxide film 65 and the field oxide film 60 makes a self-aligned position, and the region to be subjected to the ion implantation is exactly defined.

Next, as shown in FIG. 7, thermal diffusion is performed to give a junction depth of about 3 $\mu$m. Owing to this thermal diffusion, the p-type diffusion layer 62 formed beforehand in the step shown in FIG. 3 is integrated with a diffusion layer of boron implanted in the step shown in FIG. 6, and one p-type base layer 16 is formed. In addition, both end faces of the region of the p-type base layer 16 are defined at the positions of the sidewalls of the U-groove 50 in a manner of self-alignment.

Next, as shown in FIG. 8, using masks of both of the LOCOS oxide film 65 and the photoresist film 66 subjected to patterning with a pattern remaining at the surface central portion of the p-type base layer 16 surrounded by the LOCOS oxide film 65 having been formed on the surface of the wafer 21 in the lattice-shaped pattern, ion implantation of phosphorus through the thin field oxide film 60 is performed for forming the $n^+$-type source layer 4. Also in this case, in the same manner as the case in which boron has been ion-implanted in the step shown in FIG. 6, the boundary portion between the LOCOS oxide film 65 and the field oxide film 60 makes a self-alignment position, and the region to be subjected to the ion implantation is exactly defined.

Next, as shown in FIG. 9, thermal diffusion is performed with a junction depth of 0.5 to 1 μm, so as to form the $n^+$-type source layer 4 and simultaneously set the channel 5. In this thermal diffusion, the end face of the region of the $n^+$-type source layer 4 to contact with the U-groove 50 is defined at the position of the sidewall of the U-groove 50 in a manner of self-alignment.

Setting of a junction depth of the p-type base layer 16 at the time of completion of this thermal diffusion becomes important. Namely, when a high voltage, is applied between the drain and the source of a completed article of the vertical type power MOSFET of the present example, it is important to set the junction depth of the p-type base layer 16 at the value not to be destroyed by the occurrence of breakdown at the edge portion 12 of the bottom face of the U-groove 50. This junction depth can be exactly defined by the thermal diffusion.

Figure 21:
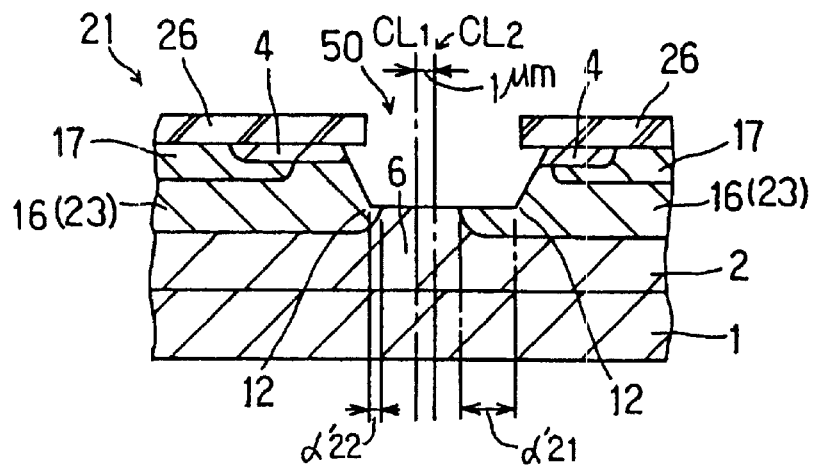
FIG. 21 is a cross-sectional view of an important part showing a practical state in which the -positional relation between the edge portion of the groove bottom face and the p-type base layer is not in bilateral symmetry due to mask deviation when the groove is formed in the production of the vertical type power MOSFET of the conventional U-MOS type.

As described above, in accordance with the steps in FIG. 6 to FIG. 9, the junction depth of the p-type base layer 16 and its shape are decided. The important fact with respect to the shape of this p-type base layer 16 is that the position of the side face of the p-type base layer 16 is self-aligned with the side face of the U-groove 50 and after that thermally diffused so that the shape of the p-type base layer 16 becomes completely bilaterally symmetrical with respect to the U-groove 50. As a result, the difference between the right and left contact lengths $\alpha'21$ and $\alpha'22$ resulting from the mask deviation of the bottom side portion of the U-groove 50 and the p-type base layer 16, which has occurred in the conventional U-MOS as shown in FIG. 21, always disappears in accordance with the production steps of the present invention, and the following formula is established.

$$\alpha'21 = \alpha'22 \qquad (11)$$

Further, the junction depth of the p-type base layer 16 can be exactly determined by condition setting of the thermal diffusion, so that it becomes unnecessary to take the length $\alpha'2$ with which the bottom side portion of the U-groove 50 contacts with the p-type base layer 16 into account. Namely, in the present example, $\alpha 2$ can be omitted in the above-mentioned formula (8), and hence the above-mentioned formula (9) is established.

Next, as shown in FIG. 10, the LOCOS oxide film 65 is removed by wet etching to expose the inner wall 51 of the U-groove 50, and then the gate oxide film 8 having a thickness of about 60 nm is formed by thermal oxidation. As described above, the inner wall 51 of the U-groove 50 is a good silicon surface having good flatness and less defect, so that the film quality of the gate oxide film 8 made by thermally oxidizing this surface, the interface state density of the interface of the channel 5, and the carrier mobility are good in a degree equivalent to the conventional DMOS.

Next, as shown in FIG. 11, a polysilicon film having a thickness of about 400 nm is deposited onto the main surface of the wafer 21, to form a gate electrode 9 in which patterning is made so as to be separated by the distance c being shorter than the distance b between the upper ends of the two adjacent U-grooves 50 by 2β. Taking the adjustment accuracy of the mask of 0.5 to 1 μm into account, when β is set to be about 1 μm so as to allow the gate electrode 9 to necessarily terminate at the flat portion of the main surface of the wafer 21, the separation distance c between the two adjacent gate electrodes 9 is 6.5 μm.

As described above, the steps shown in FIG. 6 to FIG. 11 are the most important parts of the production steps in the present example, wherein the LOCOS oxide film 65 is used as the mask for the double diffusion of the manner of self-alignment, the p-type base layer 16, the $n^+$-source layer 4 and the channel 5 are formed, and then the LOCOS oxide film 65 is removed, after which the gate oxide film 8 and the gate electrode 9 are formed.

Next, as shown in FIG. 12, using the photoresist film 68 subjected to patterning as a mask, boron is ion-implanted through the oxide film 67 for forming a $p^+$-type base contact layer 17.

Next, as shown in FIG. 13, thermal diffusion is performed with a junction depth of about 0.5 μm, and the $p^+$-type base contact layer 17 is formed. In this thermal diffusion, the size e of the exposure of the $p^+$-type base contact layer 17 to the surface is about 1.5 μm, which is determined by a pattern size of the photoresist film 68.

As shown in FIG. 1(b), an interlayer insulation film 18 comprising BPSG is formed on the main surface of the wafer 21, a part of which is subjected to a contact hole opening so as to expose the $p^+$-type base contact layer 17 and the $n^+$-type source layer 4. Further, a source electrode 19 comprising an aluminum film is formed, so as to make ohmic contact between the $p^+$-type base contact layer 17 and the $n^+$-source layer 4 through the above-mentioned contact hole. Further, for protection of the aluminum film, a passivation film (not shown in the figure) comprising silicon nitride or the like is formed by the plasma CVD method or the like, and a drain electrode 20 comprising three-layer film of Ti/Ni/Au is formed on the back face of the wafer 21, so as to make ohmic contact with the $n^+$-type semiconductor substrate 1.

As described above, in the structure and the production method of the vertical type power MOSFET according to the present example explained using FIG. 2 to FIG. 13 and FIG. 1, the following effects are provided.

(1) As compared with the conventional U-MOS shown in FIG. 15, a different factor among the conditions for determining the unit cell size a given by the formula (1) to the formula (7) is a shown by the formula (9) and the formula (10), which can be reduced into 1.5 μm from conventional 3 μm. As a result, according to the formula (3), the unit cell size a can be reduced from conventional 14.5 μm up to a value given by the following formula (12), and it is possible to allow the ON-resistance per area to further approach that of the R-MOS device.

$$a = 8.5 + 2 \times 1.5 = 11.5 \, [\mu m] \qquad (12)$$

(2) The silicon surface on which the channel portion is formed is the silicon surface made by removing the oxide film formed by the LOCOS oxidation method by means of the wet etching, wherein the flatness of the surface is good, and there is no defect at all. Therefore, in relation to the film quality of the gate oxide film made by thermally oxidizing this surface, the problems of the insulation inferiority, the decrease in the mobility due to defects of the interface of the channel portion, the change in the threshold voltage and the like are small in a degree equivalent to the conventional DMOS type. Asia result, the yield is high and the reliability is high.

(3) Methods in which delicate management is required in production steps as represented by the reactive ion etching in the R-MOS device are not used, but the LOCOS oxidation method, in which management of production is extremely easy and the size accuracy and the reproducibility are good, is used, so that the throughput and the yield in the production steps are high, and the production cost is low.

As described above, the present invention has been concretely explained on the basis of the above-mentioned first example, however, it is needless to say that the present invention is not limited to the above-mentioned example, which can be variously changed within a range without deviating from the gist thereof.

Figure 22:
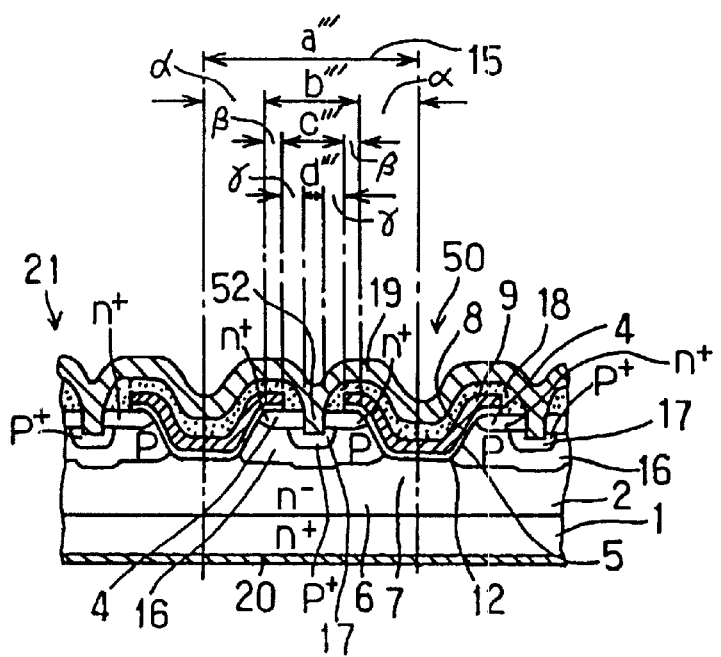
FIG. 22 is a cross-sectional view of an important part of a vertical type power MOSFET according to the second example of the present invention.

For example, in the second example shown in FIG. 22, a source electrode 19 is allowed to make ohmic contact with an $n^+$-type source layer 4 and a $p^+$-type base contact layer 17 through a groove 52, and especially there is given a structure in which the source electrode 19 makes ohmic contact with the side face of the $n^+$-type source layer 4. In order to fabricate this structure, in the production steps shown in FIG. 2 to FIG. 13, the $n^+$-source layer 4 is diffused and formed on the whole face of the upper face of the p-type base layer 16 to constitute the gate structure, and further when the contact hole is opened through the interlayer insulation film 18, a groove 52 may be formed penetrating through the interlayer insulation film 18 and the $n^+$-type source layer 4 to arrive at the $p^+$-type base contact layer 17. Incidentally, setting can be made variously such that the $p^+$-type base contact layer 17 is formed before the formation of the $n^+$-type source layer 4, is formed by performing ion implantation of boron with increasing the acceleration voltage after the formation of the $n^+$-type source layer 4, and is formed simultaneously with the $n^+$-type source layer 4 by thermal diffusion using ion implantation of boron before thermal diffusion for the formation of the $n^+$-type source layer or the like.

According to this structure, it becomes unnecessary to take the plane distance δ between the end of the contact hole and the end of the portion of exposure of the base contact layer 17 to the surface into account in FIG. 1(b). Further, it is unnecessary to especially define the size e of the portion of exposure of the base contact layer 17 to the surface, and when the contact hole having a size of d is opened, the base contact layer 17 can be simultaneously exposed. Namely, according to the structure and the production method of the present second example, a part of the formula (1) to the formula (3) in relation to the conventional U-MOS device is changed as follows.

$$d'''=1.5\ [\mu m]$$

$$c'''=1.5\ [\mu m]$$

$$b'''=1.5\ [\mu m]$$

$$a'''=b'''+2\alpha \quad (13)$$

Therefore, according to the formula (13) and the formula (10), the unit cell size of the vertical type power MOSFET can be made small into not more than 10 μm as follows.

$$a'''=6.5+2\times 1.5=9.5\ [\mu m] \quad (14)$$

the cell size equivalent to the conventional R-MOS becomes possible, and a remarkable reduction in the ON-resistance can be achieved. Moreover, in the same manner as the first example, the vertical type power MOSFET in which the yield and the reliability are high is obtained.

Next, the third example of the present invention will be explained. In the following explanation, referring to the production method of the vertical type power MOSFET according to the first example of the present invention and its structural figures shown in FIG. 1 to FIG. 13, explanation made herein is limited to portions in which the present third example is different from the above-mentioned first example or portions which are newly set in the third example, and since the other portions are the same as those of the above-mentioned first example, their explanation will be omitted.

In the third example, in FIG. 2, the wafer 21 is selected to have the index of plane of its main surface which is (111) or those near it. Thus the surface of the $n^-$-type epitaxial layer 2 corresponding to the bottom face of the LOCOS oxide film 65 formed on the wafer 21 in the step shown in FIG. 5, that is the bottom face 53 of the U-groove 50 is parallel to the main surface, so that its index of plane is also (111).

In addition, in FIG. 1(a), owing to the optimization of the surface directions of the sides of the rectangular unit cell 15 with respect to the surface direction of the main surface of the wafer 21, and the optimization of the inclination angle of the side face 54 of the U-groove 50 by condition setting in the LOCOS oxidation step shown in FIG. 5, the index of plane of the side face 54 of the U-groove 50 is set to be an index near (100) in which the interface state density is less.

Thus in the step for forming the gate oxide film 8 shown in FIG. 10, depending on the difference in the index of plane between the bottom face 53 (the index of plane is (111) as described above) of the U-groove 50 and the side face 54 (the index of plane is an index near (100) as described above), a step condition is selected in which the oxidation velocity is faster at the bottom face 53. Namely, a relatively rapid oxidation time in which the oxidation of silicon is controlled by rate-determination of reaction and a thin oxide film are necessary conditions, wherein the thin gate oxide film formation of about 60 nm satisfies the conditions. According to the conditions, the thickness $t_B$ of the gate oxide film formed on the surface of the bottom face 53 of the U-groove 50 becomes thicker than the thickness $t_S$ of the gate oxide film formed on the surface of the side face 54 of the U-groove 50. Namely, there is given $$t_S < t_B \quad (15)$$

for example, following numerical values are obtained as $t_S$ and $t_B$.

$$t_S=60\ [nm],\ t_B=80\ [nm] \quad (16)$$

Next, the function will be explained in which the third example is superior to the first example owing to its modification of its structure.

In the third example, as shown in the formulae (15) and (16), the thickness $t_B$ of the gate oxide film formed on the surface of the bottom face 53 of the U-groove 50 in FIG. 1 can be made thicker than the thickness $t_S$ of the gate oxide film formed on the surface of the side face 54 of the U-groove 50. Thus, even when a high voltage is applied between the drain electrode 20 and the source electrode 19, the electric field in the gate oxide film formed at the surface of the bottom face 53 of the U-groove 50 can be reduced, and the dielectric breakdown of the gate oxide film can be prevented. In addition, the gate input capacity of the bottom face portion of the U-groove 50 constituted by the bottom face 53 of the U-groove 50, the gate oxide film formed on its surface and the gate electrode 9 decreases in inverse proportion to the thickness of the gate oxide film, so that high-speed switching becomes possible.

In addition, in the third example, the index of plane of the side face 54 of the U-groove 50 is set to be an index near (100) in which the interface state density is less so as to provide a low interface state density of the channel portion 5, so that the stability of the threshold voltage is good, the mobility of the channel portion is not decreased, and the resistance to the hot carrier is also strong, so that the long-term reliability in electric characteristics of the vertical type power MOSFET can be maintained.

Figure 23:
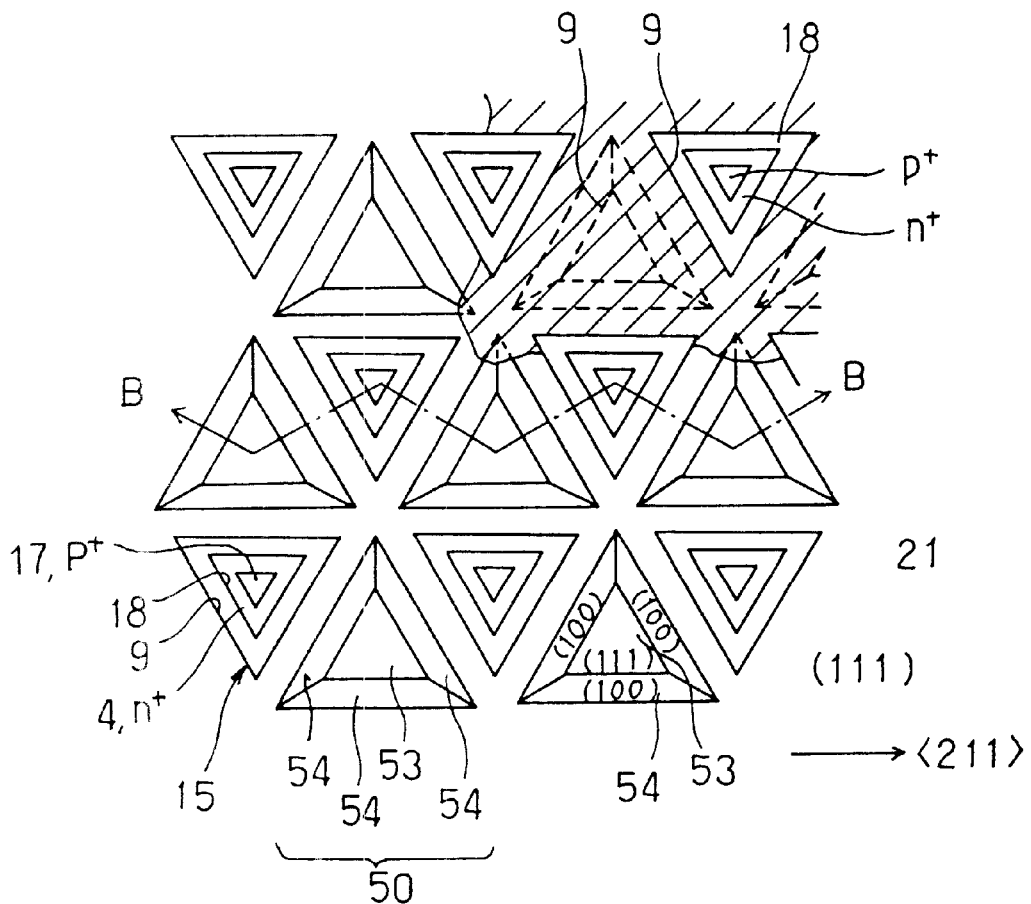
FIG. 23(a) is an illustrative plane view showing a part of a vertical type power MOSFET according to the fourth example of the present invention.
FIG. 23(b) is a cross-sectional view taken along line B—B in FIG. 23(a)
Figure 23:
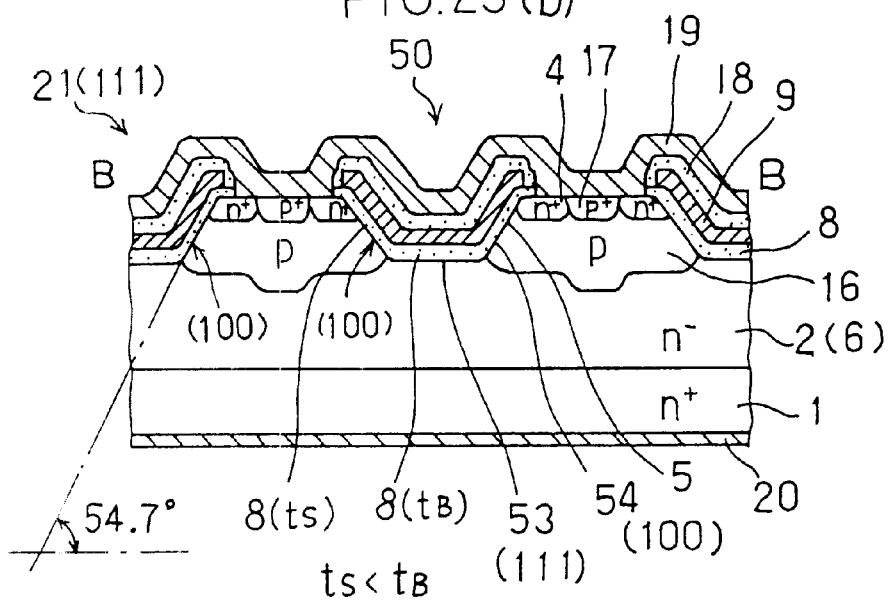

As described above, in the third example, since the explanation has been made only for the case of the rectangular unit cell shown in FIG. 1(a), it was impossible to set index of planes of all of the side faces 54 of the U-groove 50 to be the (100) plane. The cause thereof is due to the fact that plane (111) lies in three-times axial symmetry because of its crystal structure, which did not match the rectangular unit cell with no three-times axial symmetry. The fourth example in which this has been improved is shown in FIG. 23.

Incidentally, FIG. 23(a) is an illustrative plane view showing a part of a vertical type power MOSFET according to the fourth example of the present invention, wherein the surface pattern of a gate electrode 9 is given by indication of a part only (the hatched area in the figure) in order to see the figure more easily, and indication of a source electrode 19 is omitted. In addition, FIG. 23(b) is a cross-sectional view taken along B—B in FIG. 23(a). In the figure, the same constitution as that in FIG. 1(b) is designated by the same symbol.

In the fourth example, as shown in FIG. 23(a), a pattern of a triangular unit cell 15 and a U-groove 50 of a triangular pattern are used, and a face direction of one side of the triangle is set to be <211>, and further as shown in FIG. 23(b), in order to provide an angle of 54.7° formed by the main surface of a wafer 21 and a side face 54 of the U-groove 50, the conditions in the LOCOS oxidation step shown in FIG. 5 are set. By doing so, index of planes of all of the side faces 54 of the U-groove 50 can be made (100) in which the interface state is the smallest, and it is possible to form channels having good characteristics equivalent to those of DMOSFET of the conventional planar type.

Here, as can understood from FIGS. 23(a), 23(b), since the U-groove 50 has the triangular shape, the p-type base layer adjacent to the U-groove 50 is surrounding the U-groove 50, that is, the p-type base layer 16 is integrally formed among all unit cells. When this vertical power MOSFET is cut taken along not-shown line connecting one corner of one unit cell and one corner nearest the one unit cell of another unit cell adjacent to the one unit cell, the p-type base layer 16 is continuously formed. Therefore, this MOSFET forms to a single-base structure.

Figure 24A:
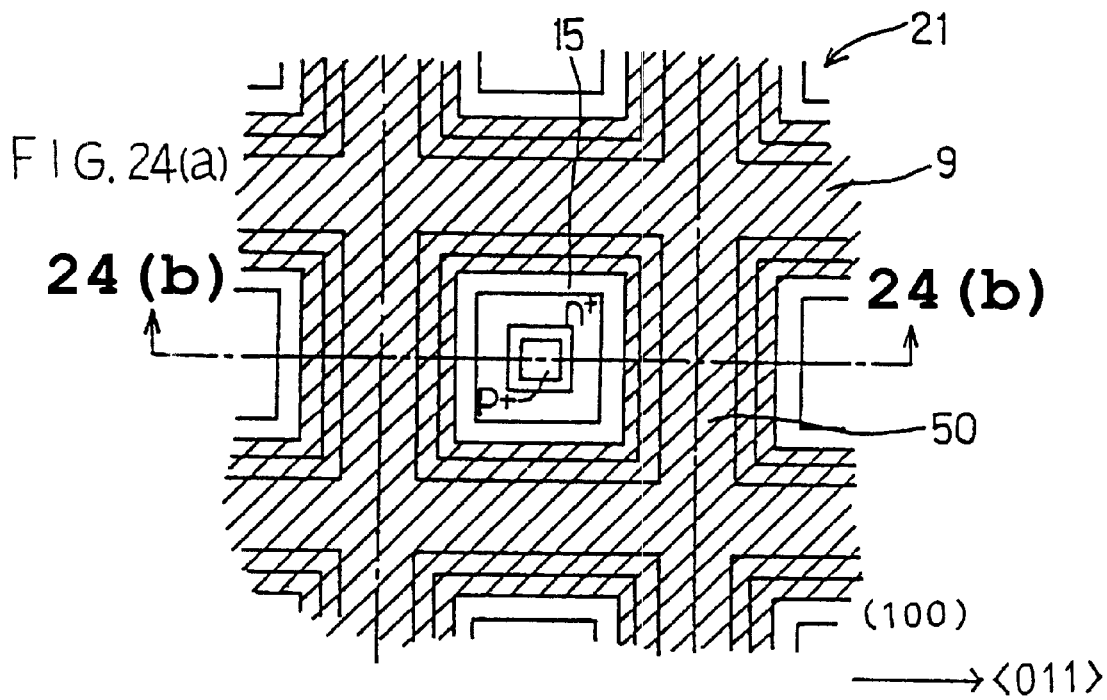
FIG. 24(a) is a plane view showing a part of a vertical type power MOSFET according to a fifth embodiment of the present invention.
Figure 24B:
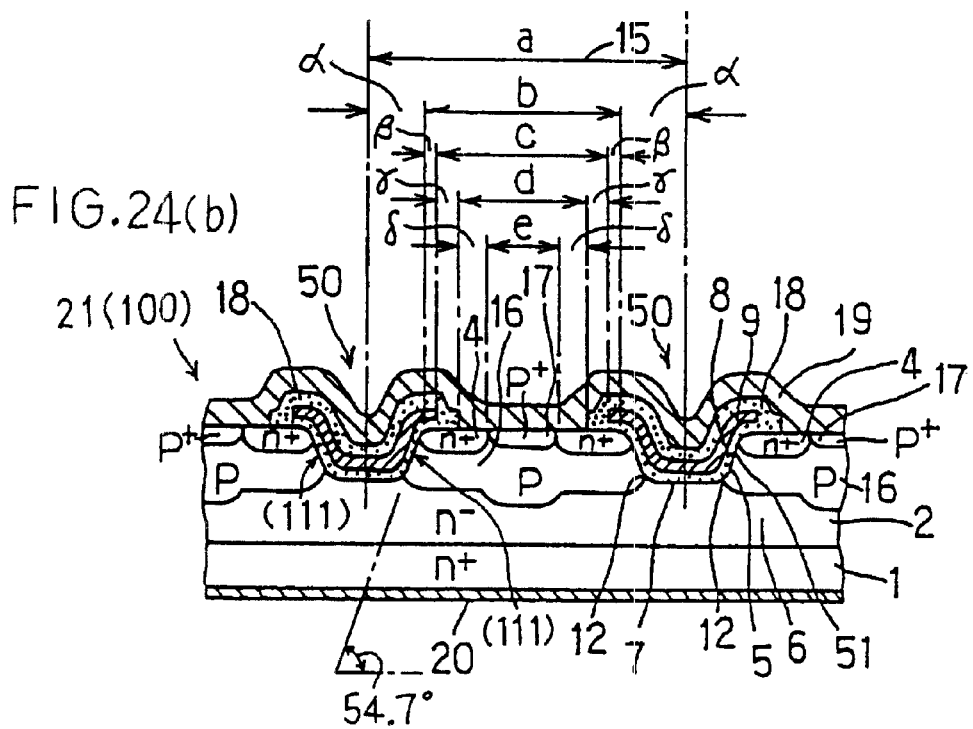
FIG. 24(b) is a cross-sectional view taken along line 24(b)—24(b) in FIG. 24(a)

FIG. 24(a) is a plane view of a vertical power MOSFET comprising rectangular unit cells 15 according to the fifth embodiment of the present invention, and FIG. 24(b) is a cross-sectional view taken along 24(b)—24(b) in FIG. 24(a). In the figure, the same constitution as that in FIGS. 1(a) and 1(b) are designated by the same symbol. In the following explanation, referring to the production method of the vertical type power MOSFET according to the first embodiment, explanation made herein is limited to portions in which the present fifth embodiment is different from the first embodiment or portions which are newly set in the fifth embodiment, and since the other portions are the embodiment substantially same as those of the first embodiment, their explanation will be omitted.

In the fifth embodiment, as shown in FIGS. 24(a) and 24(b), the wafer 21 is selected to have the index of plane of its main surface which is (101) or those near it. Thus the surface of the n⁻-type epitaxial layer 2 corresponding to the bottom face of the LOCOS oxide film 65 formed on the wafer 21 in the corresponding step shown in FIG. 5, that is the bottom face 53 of the U-groove 50, is parallel to the main surface, so that its index of plane is also (100).

In addition, as shown in FIG. 24(a), owing to the optimization of the directions of the sides of the rectangular unit cell 15 with respect to the plane orientation of the main surface of the wafer 21, and the optimization of the inclination angle of the side face 54 of the U-groove 50 by condition setting in the LOCOS oxidation step shown in FIG. 5, the index of plane of the side face 54 of the U-groove 50 is set to be an index of approximately (111). That is, the index of plane of the side surface 54 of the U-groove 50 after removing the LOCOS oxide film 65 is also approximately (111).

In other words, in the fifth embodiment, as shown in FIG. 24(a), a pattern of a rectangular unit cell 15 and a U-groove 50 of a lattice-like pattern are used, and a face direction of one side of the rectangle or the lattice is set to be <011>, and further as shown in FIG. 24(b), in order to provide an angle of 54.7° formed by the main surface of a wafer 21 and a side face 54 of the U-groove 50, the conditions in the LOCOS oxidation step shown in FIG. 5 are set. By doing so, index of planes of all of the side faces 54 of the U-groove 50 can be made (111).

More specifically, in the above fifth embodiment, the surface of the silicon substrate 1 with an index of plane of (100) is used, the conditions of etching (FIG. 4) and LOCOS oxidation (FIG. 5) are selected by using the silicon nitride film 63 patterned at a roughly right angle or in roughly parallel to an direction of <011> on the surface of the silicon substrate 1, and an angle of the side surface 54 of the U-groove 50 to the surface of the substrate 1 is exactly controlled to be 54.7° as shown in FIG. 24(b). By doing so, all of the side surfaces 54 of the U-groove 50 are made to be in an equivalent crystal surface with an index of plane of (111). As a result, the side surface 54 of the U-groove 50 can be made to be crystal surface, the channel mobility can be made high and the ON-resistance can be reduced.

Figure 25A:
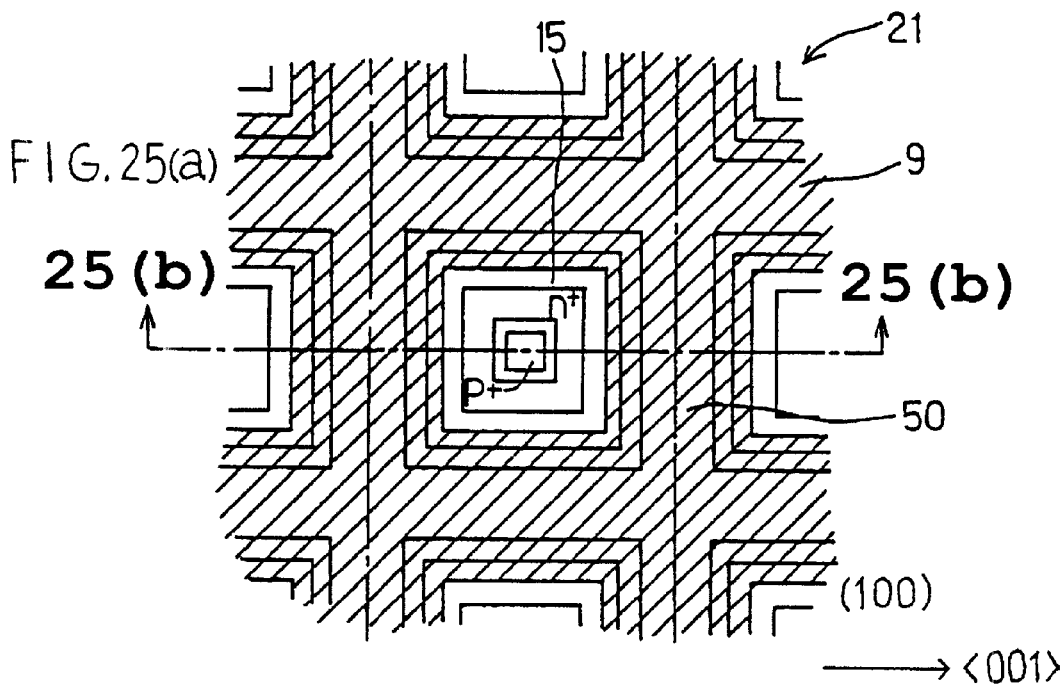
FIG. 25(a) is a plane view showing a part of a vertical type power MOSFET according to a sixth embodiment of the present invention.
Figure 25B:
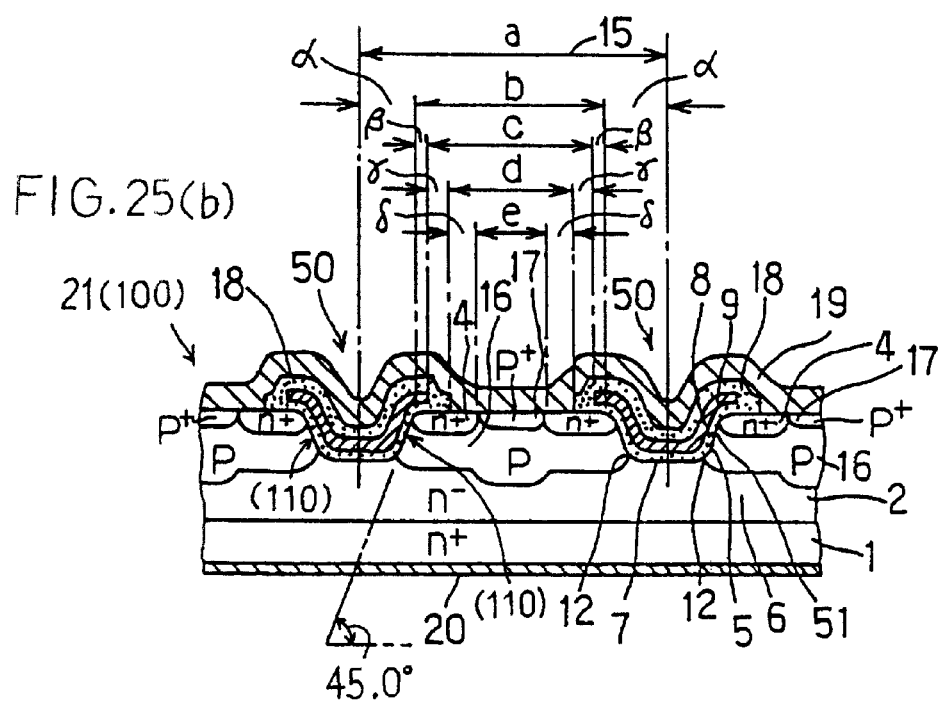
FIG. 25(b) is a cross-sectional view taken along line 25(b)—25(b) in FIG. 25(a)

Furthermore, the plane orientation of the silicon substrate 1 and the patterning shape may be selected so that the index of plane of side surface 54 of the U-groove 50 can be (110) as shown in FIGS. 25(a) and 25(b). FIG. 25(a) is a plane view of a vertical power MOSFET comprising rectangular unit cells 15 according to the sixth embodiment of the present invention, and FIG. 25(b) is a cross-sectional view taken along 25(b)—25(b) in FIG. 25(a).

In the sixth embodiment, as shown in FIG. 25(a), a pattern of a rectangular unit cell 15 and a U-groove 50 of a lattice-like pattern are used, and a face direction of one side of the rectangle or the lattice is set to be <001>, and further as shown in FIG. 25(b), in order to provide an angle of 45.0° formed by the main surface of a wafer 21 and a side face 54 of the U-groove 50, the conditions in the LOCOS oxidation step shown in FIG. 5 are set. By doing so, index of planes of all of the side faces 54 of the U-groove 50 can be made (110).

Now, a manufacturing method for a semiconductor device which makes the plane orientation of the side surface 54 of the U-groove 50 to be a (110) plane will be described only as to those parts which are different from the fifth embodiment.

In the silicon nitride film patterning process illustrated in FIG. 3, the silicon nitride film 63 is patterned to have an open pattern which is perpendicular and parallel to an orientation of <001> in its surface pattern. By using this silicon nitride film 63 as a mask, the etching for forming groove 64 (FIG. 4) and the LOCOS oxidation (FIG. 5) are performed. In these processes, the conditions of etching and LOCOS oxidation are selected so as to control an angle, which is an angle of the side surface 54 of the U-groove 50 to the surface of the substrate 1, so that the index of plane of the channel formation part-on the side surface 54 of the U-groove 50 is set to be (110).

The effect of this sixth embodiment will be described. Like the fifth embodiment, all of the side surfaces 54 of the U-groove 50 are made a crystal surface with the (110) plane having a high channel mobility, and therefore the channel mobility can be increased and the ON-resistance can be reduced.

That is, when silicon substrate 1 with an index of plane of (100) is used, the conditions of the etching and LOCOS oxidation is selected by using the silicon nitride film 63 patterned at a roughly right angle or roughly parallel to a direction of <001> on the surface of the silicon substrate 1 and an angle of the side surface 54 of the U-groove 50 to the surface of the silicon substrate 1 is controlled to be 45.0° as shown in FIG. 25(b), all of the side surfaces 54 of the U-groove 50 can be made to be in an equivalent crystal surface having an index of (110). As a result, the side surface 54 can be made to be a crystal surface and the channel mobility can be increased, whereby the ON-resistance can be reduced. In the above fifth and sixth embodiments, the silicon substrate 1 with an index of plane of (100) is used and the silicon nitride film 63 patterned at a right angle and parallel to an orientation <011> or <001> of the surface of the silicon substrate 1. However, even if this condition is deviated from the above, as long as the channel mobility on the four surfaces, i.e., all side surfaces 54, of the U-groove 50 can be improved and an interfacial level can be formed with a high symmetry, this case can be included in the present invention. Also, in the above fifth and sixth embodiments the lattice-like pattern is used for silicon nitride film patterning at a right angle and parallel to an orientation of <011> or <001>. However, it is not limited to the lattice-like pattern but a stripe-like pattern may also be used and the patterning may be at either a right angle or parallel to an orientation of <011> or <001>.

According to the above-mentioned fourth fifth and sixth embodiments, all of the side faces 54 of the U-groove 50 can be made to have the same crystal orientation, and therefore, when channels are formed on the respective surfaces 54 of the U-groove 50, currents flowing therethrough can be made uniform and local concentration of current can be prevented. Therefore, a vertical type power MOSFET with high reliability can be obtained.

Figure 26:
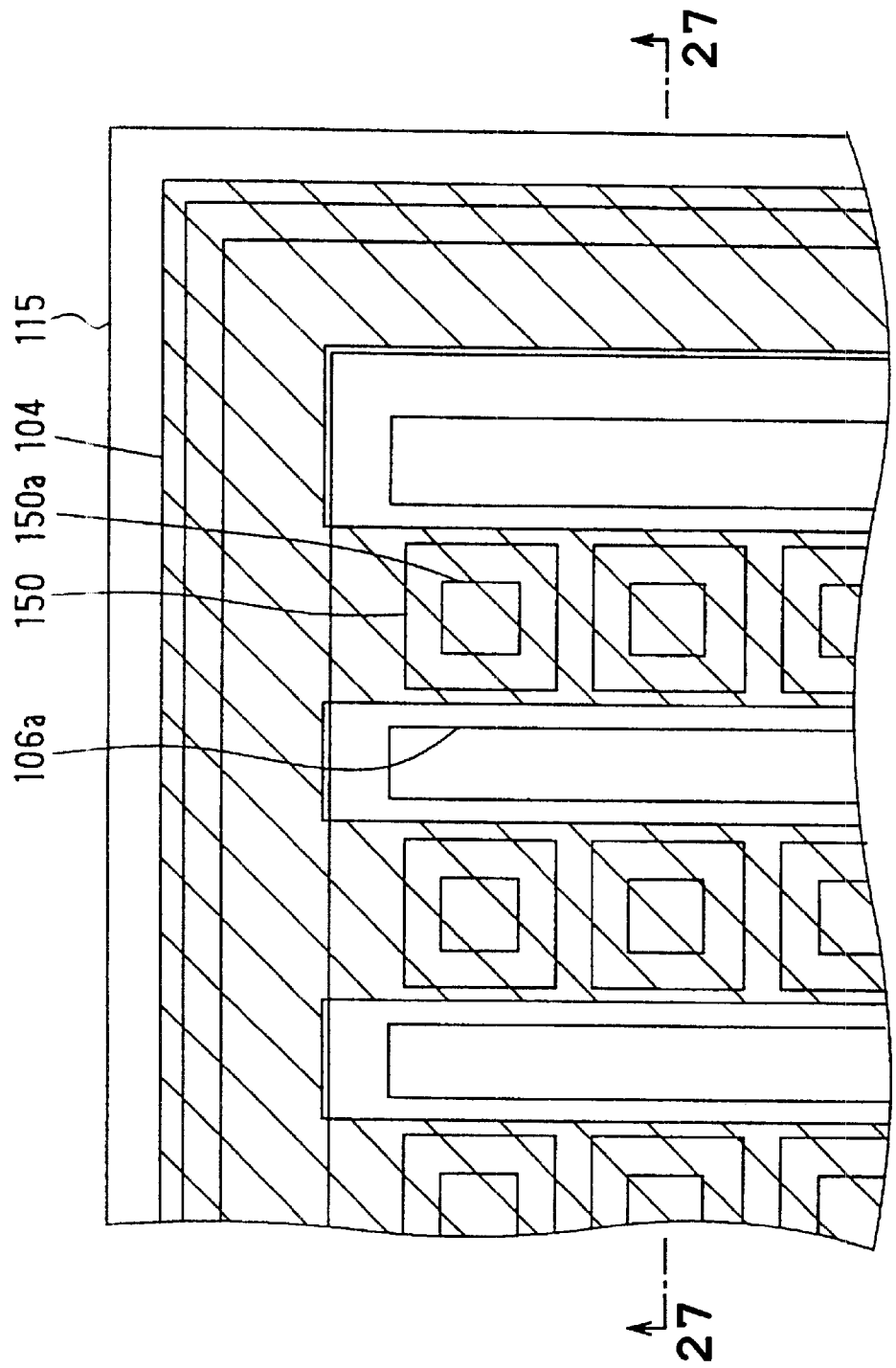
FIG. 26 is a diagram showing a part of a vertical type power MOSFET according to a seventh embodiment of the present invention.
Figure 27:
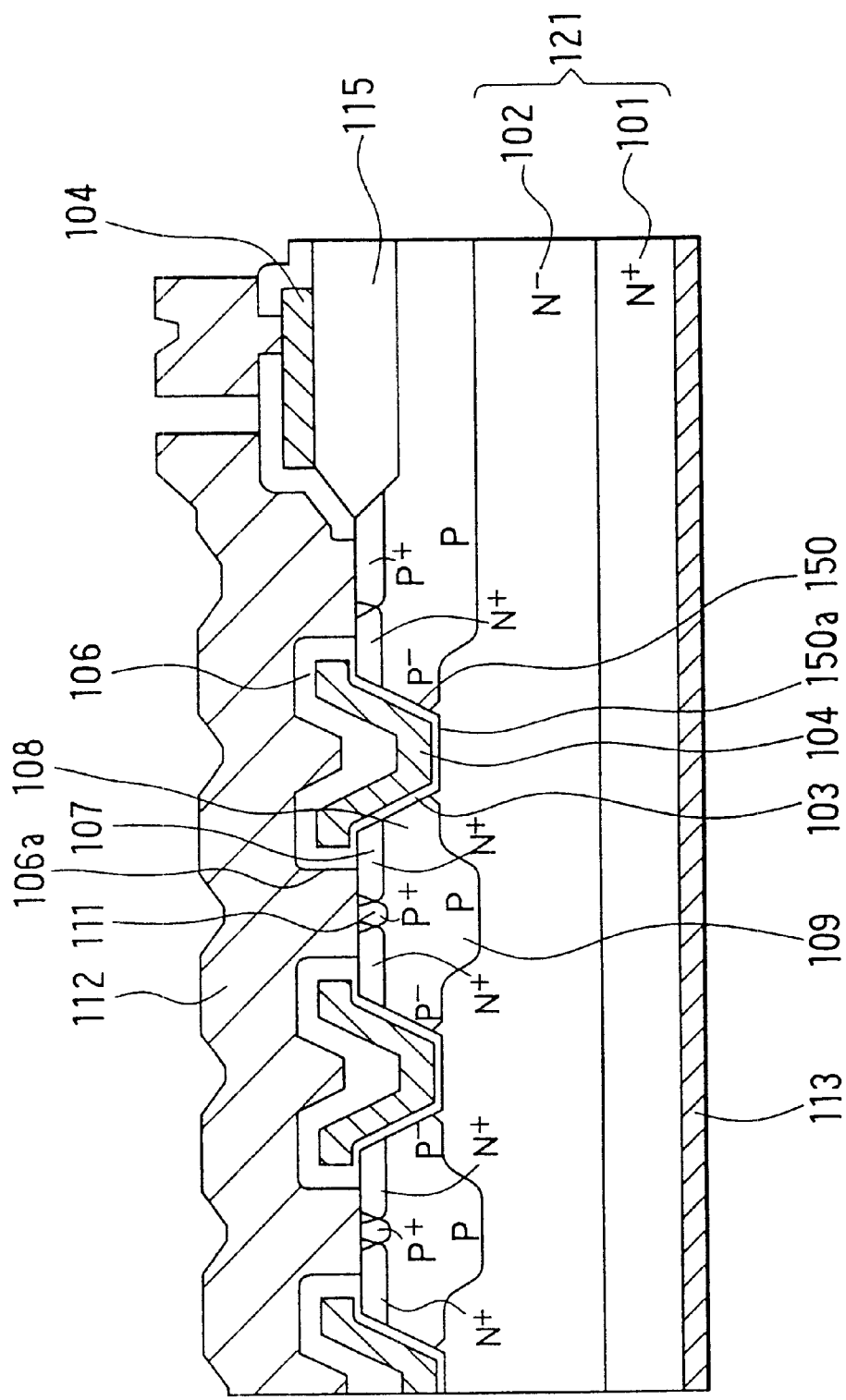
FIG. 27 is a cross-sectional view taken along line 27—27 in FIG. 26.

Next, a concave type vertical power MOSFET according to a seventh embodiment will be explained with reference to FIGS. 26, 27. FIG. 26 is a plan view of the concave type vertical power MOSFET 100 according to a seventh embodiment. FIG. 27 is a cross-sectional view taken along line 27—27 in FIG. 26.

This vertical power MOSFET 100 has a plurality of unit cells arranged to a matrix shape on a plane with a predetermined pitch width. Each of the unit cells has a MOSFET structure in which inside surfaces of so-called concave type U-grooves 150 are used as channel portions.

As shown in FIG. 27, a wafer 121 used for the vertical power MOSFET has a semiconductor substrate 101 and an n⁻-type epitaxial layer 102 formed on the semiconductor substrate 101. The semiconductor substrate 101 is made of an n⁺-type silicon having an impurity concentration of approximately $3\times10^{19}$ cm$^{-3}$ and has a thickness of approximately 500 to 625 μm. The n⁻-type epitaxial layer 102 has an impurity concentration of approximately $1\times10^{16}$ cm$^{-3}$ and has a thickness of approximately 7 μm. The unit cells are formed on a main surface of the wafer 121.

A plurality of U-grooves 150 are formed with an unit cell size of approximately 12 μm at the main surface of the wafer 121. A gate electrode 104 made of polysilicon having a thickness of approximately 400 nm is formed on inside sidewalls of the U-grooves 150 and on a part of the main surface of the wafer 121 with a gate oxide film 103 having a thickness of approximately 60 nm interposed therebetween. The gate electrode 104 is shown as a hatching portion in FIG. 26. Each gate electrode 104 of each unit cell is integrally formed. An interlayer insulation film 106 made of BPSG is formed on the gate electrode 104.

An n⁺-type source layer 107 having a junction depth of approximately 0.5 μm and a p-type base layer 108 having a junction depth of approximately 2 μm are formed on the main surface portion on the wafer 121, which has the U-grooves 150. At the sidewalls of the U-grooves 150, the p-type base layer 108 is arranged between the n⁺-type source layer 107 and the n⁻-type epitaxial layer 102 so that channel portions are defined at the sidewalls of the U-grooves. In this embodiment, the channel portions are formed to a rectangular shape. Here, the junction depth of the p-type base layer 108 is set so as to prevent edge portions at the bottom of the U-grooves 150 from occurrence of a breakdown.

Figure 28:
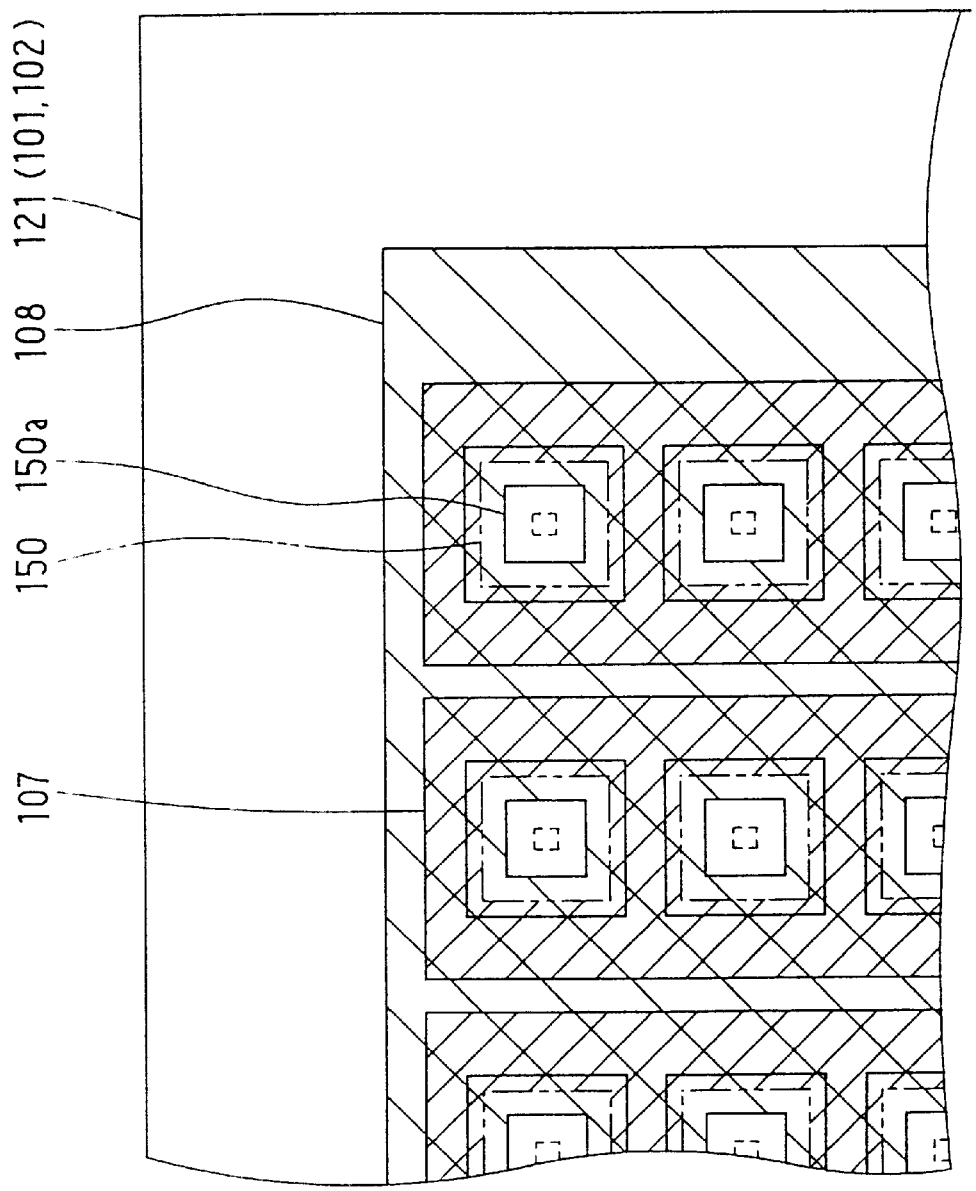
FIG. 28 is a diagram illustrating a p-type base layer 108 of the vertical type power MOSFET shown in FIG. 26.

FIG. 28 shows a layout of the p-type base layer 108. In this figure, the p-type base layer 108, the U-groove 150 (including the bottom surface 150a), and the n⁺-type source layer 107 are shown by solid lines. Especially, the p-type base layer 108 is shown by a hatching portion. As shown in this figure, this vertical power MOSFET 100 has a single-base structure, that is, each p-type base layer 108 of each unit cell is connected each other. In more detail, the p-type base layer 108 is formed on substantially whole main surface of the wafer 102 except the bottom surfaces 150a of the U-grooves 150 of each unit cell. That is, the bottom surface 150a of the groove 150, which is formed to rectangular shape, is defined by a portion where the p-type base layer 108 is not formed.

In this single-base structure, it can prevent an impurity diffusion amount from decreasing at corner portions of the p-type base layer 108, that is, corner portions of the rectangular portion where the p-type base layer is not formed. Therefore, it can prevent an impurity concentration from being lowered at this portion.

In this embodiment, as shown by dotted lines, depletion layers extend toward center portion of the bottom surfaces 150a of the U-grooves 150. Since the impurity concentration of the corner portions of the p-type base layer 108 does not lower, it can reduce the difference in distance from the end portion of the p-type base layer 108 to the end portion of the depletion layer. Accordingly, the withstand voltage at the end portion of the depletion layer can improve. Furthermore, even if resistance of each portion in the p-type base layer 108 is different from each other, since current can flow through a low-resistance portion in the p-type base layer 108 forming the single base structure, it can improve the surge withstand voltage when a surge voltage is input from an inductance load L.

Here, the gate electrode 104 is formed to a slit-shape so as to connect the unit cells in every line vertically arranged in FIG. 28, that is, so as to cover a plurality of channels vertically arranged in this figure. Accordingly, the rectangular channel has a structure that two channel portions are parallel to a longitudinal direction of the gate electrode 104, and the other two channel portions are perpendicular to the longitudinal direction of the gate electrode 104.

A p-type deep-base layer 109 having a junction depth deeper-than that of the p-type base layer 108 is formed at the center portion of the p-type base layer 108. When a high voltage is applied between a drain and a source, a breakdown occurs at the p-type deep-base layer 109.

A p-type contact layer 111 having a high impurity concentration is formed at a surface portion of the n⁻-type epitaxial layer 102 of the center portion of the unit cell. As shown in FIG. 26, the contact layer 111 extends parallel to the longitudinal direction of the gate electrode 104, and is commonly used by unit cells.

A contact hole 106a is formed in the interlayer insulation film 106 to expose a part of the n⁺-type source layer 107 and p-type contact layer 111. Furthermore, a source electrode 112 is formed on the interlayer insulation layer 106 on the gate electrode 104, n⁺-type source layer 107 and the p-type contact layer 111. The source electrode 112 is contacted by ohmic-contact to the part of the n⁺-type source layer 107 and p-type contact layer 111. Accordingly, the p-type base layer 108 is electrically connected to the source electrode 112 through the p-type contact layer 111.

Here, an oxide film 115 is formed to electrically isolate an active region of an element from a non-active region of the element.

Furthermore, a drain electrode 113 is formed on a back surface of the wafer 121, that is a back surface of the semiconductor substrate 101, to contact to the semiconductor substrate by ohmic-contact.

According to the vertical power MOSFET 100 constructed the above, since the channel portions are defined at the sidewalls of the U-grooves 150, it can substantially eliminate a JFET resistance and can reduce the ON-resistance.

Figure 29A:
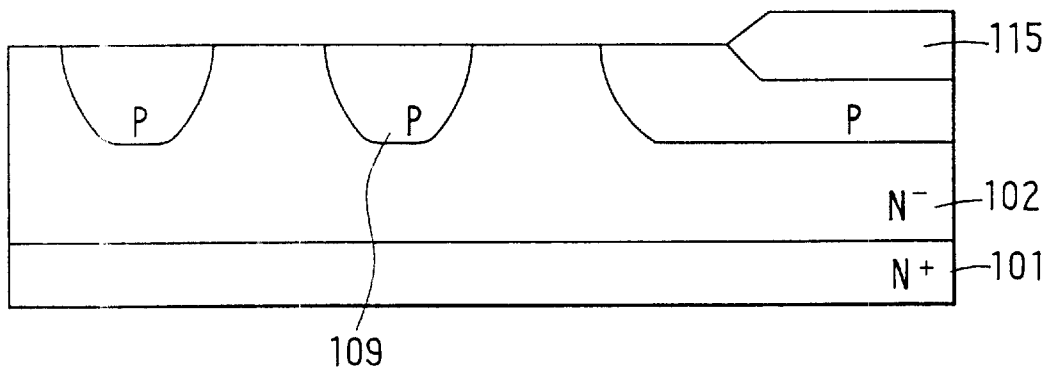
FIG. 29(a) through FIG. 29(e) are cross-sectional views of important parts to be used for the explanation of production steps of the vertical type power MOSFET shown in FIGS. 26–28.

Next, a production method of a vertical power MOSFET 100 will be explained with reference to FIGS. 29(a)–29(e).
[Step Shown in FIG. 29(a)]

A wafer 121 is provided. This wafer 121 is formed by growing an n⁻-type epitaxial layer 102 on a main surface of a semiconductor substrate 101 made of n⁺-type silicon, which has a high impurity concentration of arsenic (As) and an index of (100). The semiconductor substrate 101 has an impurity concentration of $3 \times 10^{19}$ cm$^{-3}$ and a thickness of 7 μm. The n⁻-type epitaxial layer 102 has an impurity concentration of $1 \times 10^{16}$ cm$^{-3}$ and a thickness of 7 μm.

After forming a predetermined mask pattern on the n⁻-type epitaxial layer 102 through a photolithography step, a p-type deep-base layer 109 is formed by ion-implanting boron (B) ions through the mask pattern.

Figure 29B:
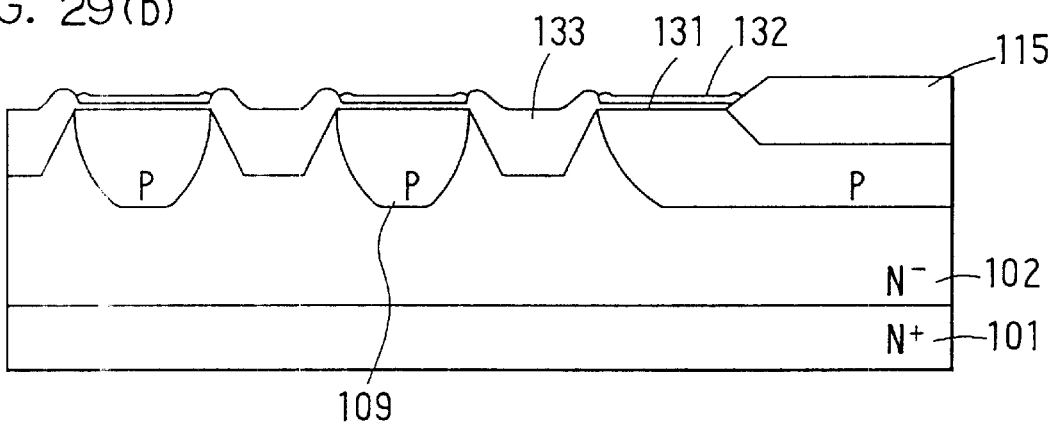

After that, a thicker oxide film 115 is formed at a region to be the non-active region of the element by a LOCOS oxide method.
[Step Shown in FIG. 29(b)]

A thermal oxide film (SiO₂ film) 131 is formed on the surface of the n⁻-type epitaxial layer 102 by thermal-oxidation of the surface. Then, a silicon nitride film (Si₃N₄ film) 132 is deposited on the thermal oxide film 131.

After that, another photolithography step is conducted on the silicon nitride film 132 to form holes at a predetermined position. Then, initial grooves are formed by etching the n⁻-type epitaxial layer 102 by a chemical dry etching method (CDE) using the silicon nitride film 132 as a mask. The CDE is an isotropic etching method, which can perform an etching with less damage.

Furthermore, the initial grooves are partially oxidized using the silicon nitride film 132 as a mask (LOCOS oxidation). By this oxidation, a LOCOS oxide film 133 is formed. At the same time, U-grooves 150 having U-shaped sections are formed at a surface of the N⁻-type epitaxial layer 102 by the LOCOS oxidation.

Figure 29C:
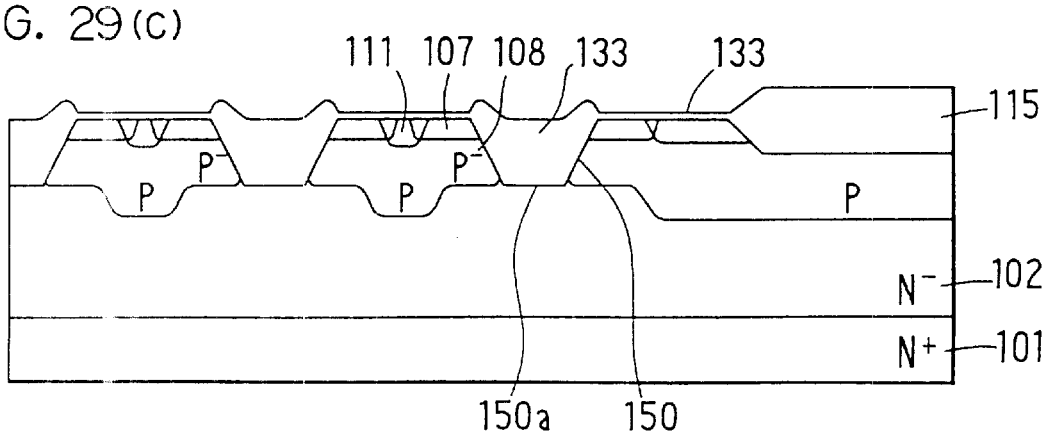
Figure 29D:
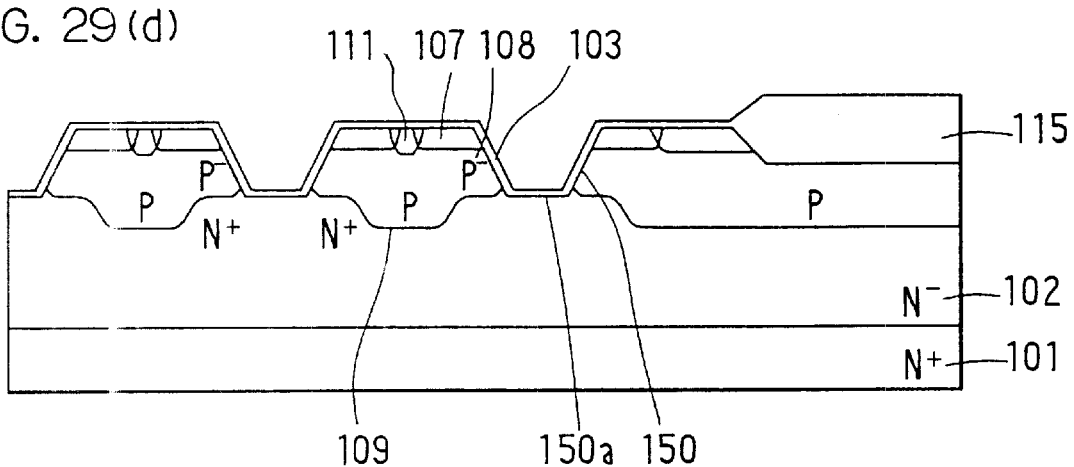

In this LOCOS oxidation, conditions of the chemical dry etching and the LOCOS oxidation are set so that an index of plane of the channel portion defined by the sidewalls of the U-grooves 150 is approximately (111) in order to allow the inner sidewall surface of the U-grooves 150 flat and less defect.
[Step Shown in FIG. 29(c)]

After removing the silicon nitride film 132, a photoresist is deposited on the wafer 121 so that the photoresist remains at the center portion of the adjacent LOCOS oxide films 133. Then, boron ions are ion-implanted to the wafer 121 to form a p-type base layer 108 by using the LOCOS oxide films 133 and the photoresist as the mask.

Furthermore, phosphorus (P) ions are ion-implanted to the wafer 121 to form a n⁺-type source layer 107 by using the LOCOS oxide films 133 and the photoresist as the mask. After that the implanted ions are thermal-diffused to form the p-type base layer 108 and the n⁺-type source layer 107.

In this way, since the p-type base layer 108 and the n⁺-type source layer 107 are formed by commonly using the LOCOS oxide films 133 and the photoresist as the mask, each of the end portions of the both the p-type base layer 108 and the n⁺-type source layer 107 are defined at a self-alignment position.

Here, when the U-groove 150 is formed relatively deeper, an opening area of each U-groove is enlarged. In the case of this embodiment+that is the channel portion is formed so as to surround the rectangular shaped U-groove 150, the channel portion becomes large as the opening area is enlarged. On the contrary, in the case that U-grooves are connected and each of the p-type base layers is separated (or sprinkled), the channel portion becomes small as the opening area is enlarged. Therefore, in this embodiment, since the p-type base layers are integrally formed, the ON-resistance can be reduced.

Next, after removing the photoresist, another photoresist is deposited again, and the another photoresist is partially opened at the center of adjacent LOCOS oxide films 133. Then, boron ions are ion-implanted to the wafer 121 to form a p-type contact layer 111 having a high impurity concentration by using the another photoresist as the mask.
[Step Shown in FIG. 29(d)]

The inner sidewall of the U-grooves 150 are exposed by removing the LOCOS oxide film 133 by applying an end effect to the silicon surface with hydrogen within an aqueous solution containing hydrofluoric acid and adjusted to an acidity/alkalinity of around pH5 with ammonium fluoride. This removing process is performed by applying an shading cloth over the wafer 121 to shade the surface with the selective oxide film from light.

After that, the wafer 121 is taken out of the aqueous solution and dried in a clean air.

Then, a thermal oxide film is formed on a sidewall of the U-groove 150 of the p-type base layer 108 on which the channel portion is to be formed until the (111) plane is formed. By this thermal oxidation process, the flatness of the surface on which the channel is to be formed is improved in terms of atomic order. This thermal oxidation process is performed by slowly inserting the wafer 121 into an oxidation furnace which is maintained within the oxygen atmosphere at a temperature of approximately 1000° C. In this thermal oxidation process, as the initial stage of the oxidation is performed at a comparatively low temperature, the scattering of impurities within the p-type base layer region 108 and n⁺-type source region 107 to the outside of the wafer 121 during the thermal oxidation process can be controlled.

After removing the thermal oxide film formed by the thermal oxidation, whole surface of the wafer 121 including the sidewall of the U-groove 150 and the bottom surface of the U-groove 150 is thermally oxidized again to form a gate oxide film 103.

Figure 29E:
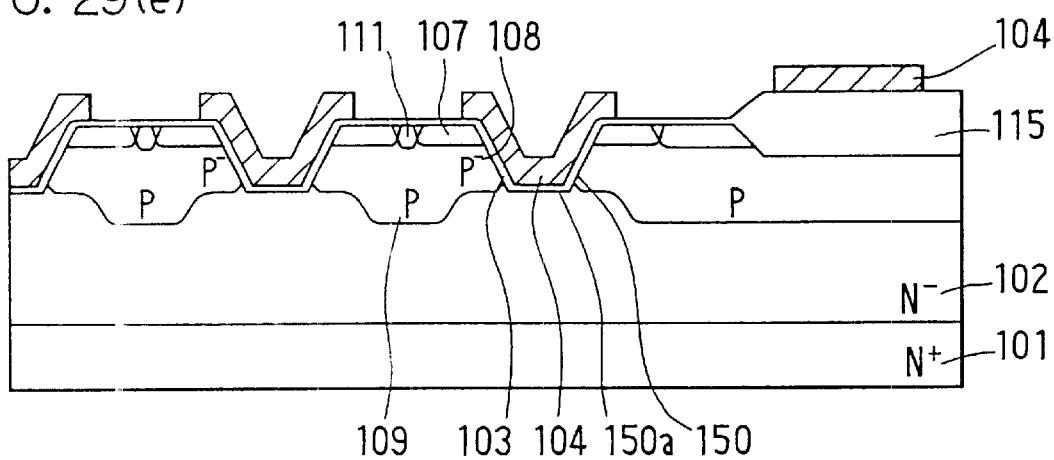

[Step Shown in FIG. 29(e)]

After depositing a polysilicon on the gate oxide film 103, the polysilicon is patterned to form a gate electrode 104.

After oxidation of the polysilicon constructing the gate electrode 104, a (not shown) interlayer insulation film 106 made of BPSG, PSG, or the like is deposited. Then, a source electrode 112, a passivation film, a drain electrode 113 are formed to complete to manufacture the vertical power MOSFET 100 as shown in FIGS. 26, 27.

Figure 30:
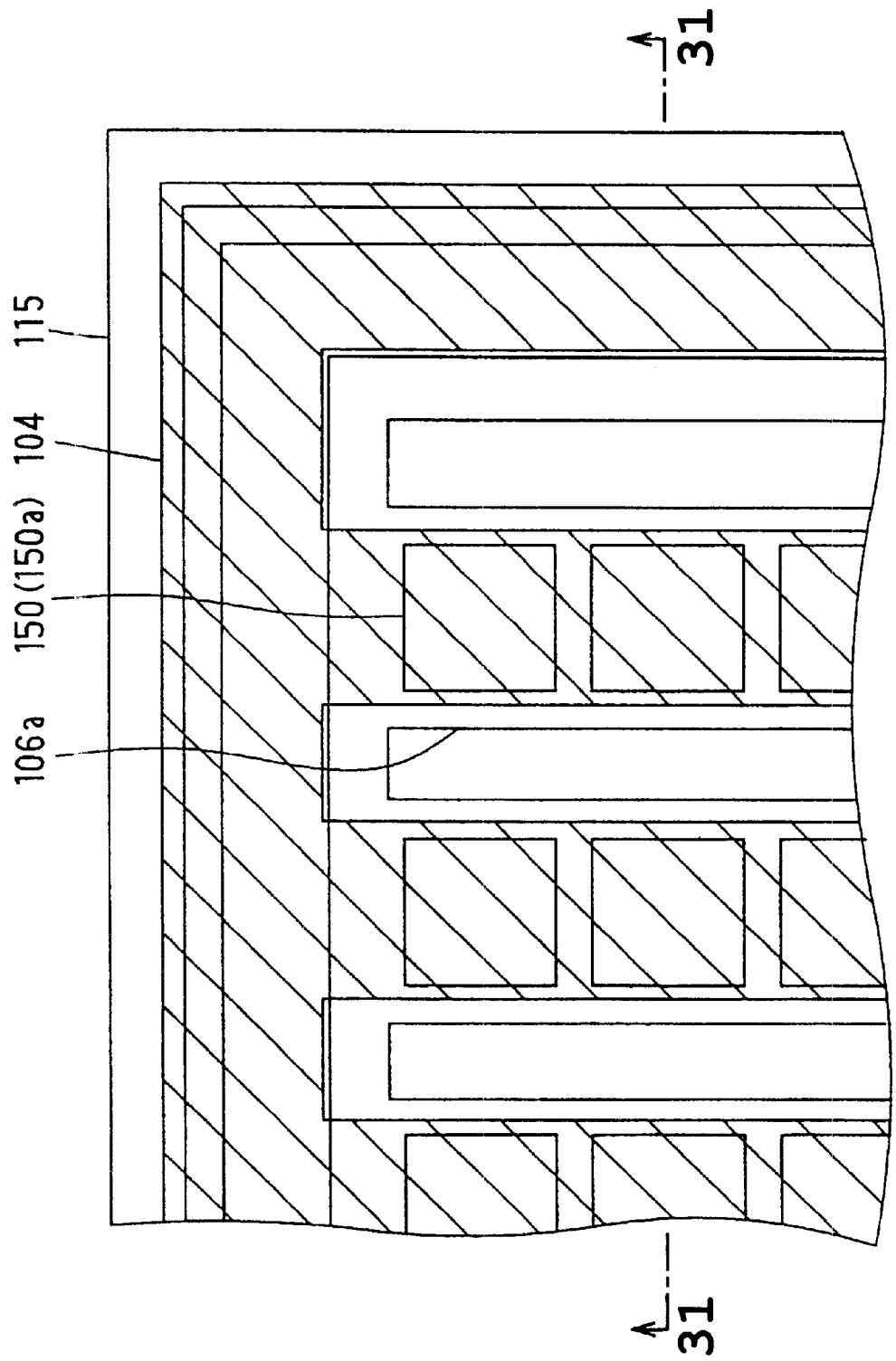
FIG. 30 is a diagram showing a part of a vertical type power MOSFET according to an eighth embodiment of the present invention.
Figure 31:
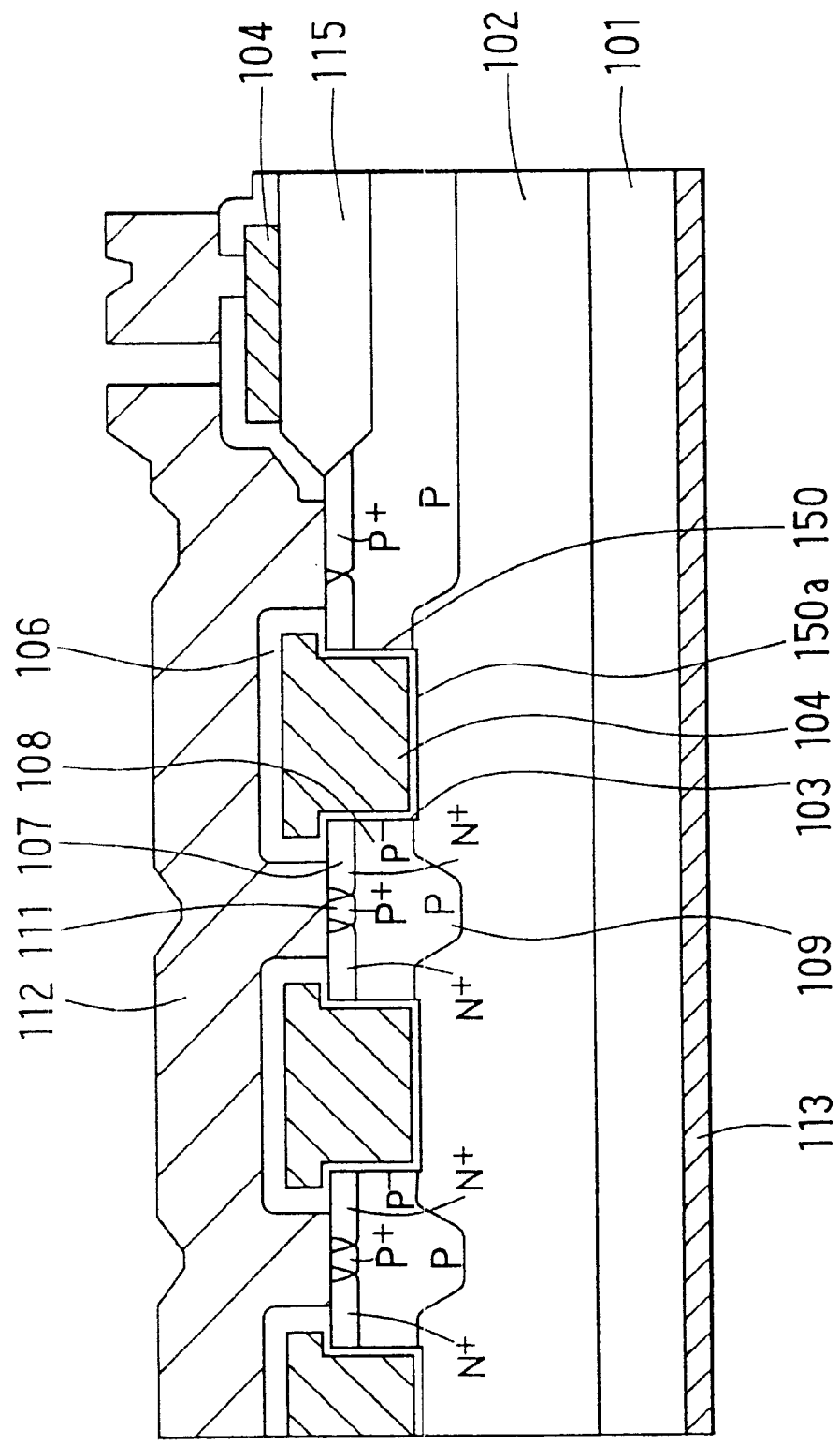
FIG. 31 is a cross-sectional view taken along line 31—31 in FIG. 30.

Next, a concave type vertical power MOSFET according to an eighth embodiment will be explained with reference to FIGS. 30, 31. FIG. 30 is a plan view of the concave type vertical power MOSFET 100 according to the eighth embodiment. FIG. 31 is a cross-sectional view taken along lines 31—31 in FIG. 30. This embodiment is substantially the same as the seventh embodiment except for a shape of a groove portion 160. The corresponding components are put the same numeral to omit its explanation.

The vertical power MOSFET 100 according to this embodiment has a groove portion 160 whose sidewall is perpendicular to the main surface of the semiconductor substrate 101. This groove portion 160 is formed by etching the n⁻-type epitaxial layer 102.

In the vertical power MOSFET 100 constructed the above, the channel portion is defined to perpendicular to the main surface of the semiconductor substrate 101.

In this vertical power MOSFET 100, the same effects as that of the seventh embodiment can be obtained by integrally forming the p-type base layer 108.

Next, a production method of a vertical power MOSFET 100 will be explained with reference to FIGS. 32(a)–32(c).

Figure 32A:
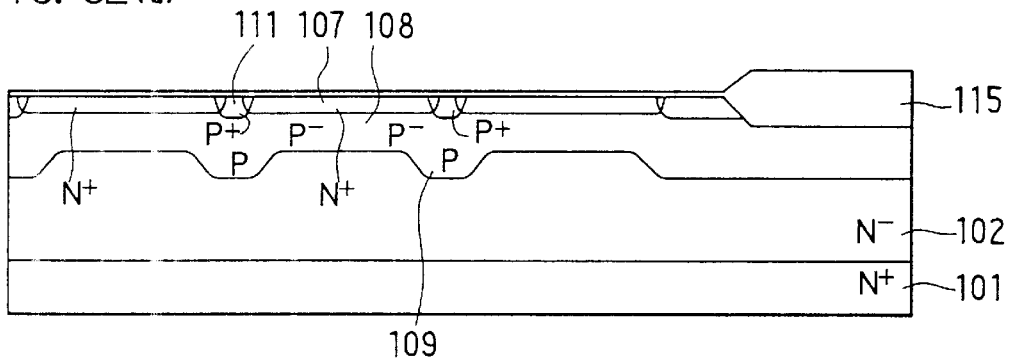
FIG. 32(a) through FIG. 32(c) are cross-sectional views of important parts to be used for the explanation of production steps of the vertical type power MOSFET shown in FIGS. 30, 31.

[Step Shown in FIG. 32(a)]

A wafer 121 having the same construction as that in the seventh embodiment is provided. A p-type deep-base layer 109 is formed by the same step shown in FIG. 29(a), and a thicker oxide film 115 is formed at a region to be the non-active region of the element by a LOCOS oxide method.

After that, a p-type base layer 108, an n⁺-type source layer 107, and a p-type contact layer 111 are formed through with a photolithography step.

Figure 32B:
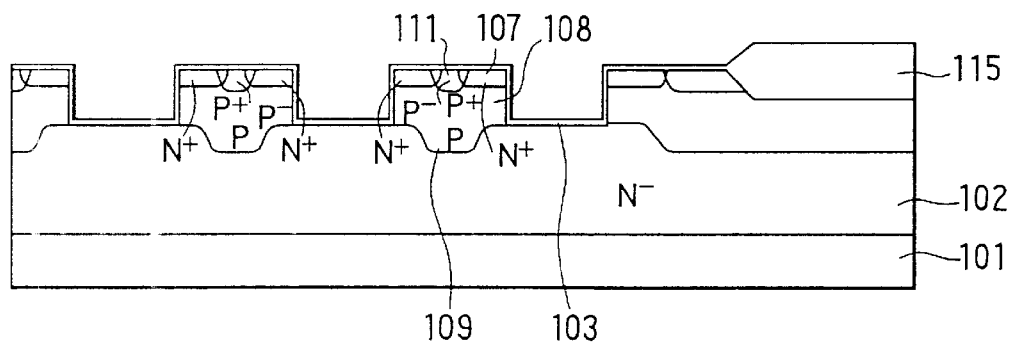

[Step Shown in FIG. 32(b)]

Next, a groove portion 160 penetrating the p-type base layer 109 and n⁺-type source layer 107 is formed by etching. By doing this step, at the sidewalls of the U-grooves 150, the p-type base layer 108 is arranged between the n⁺-type source layer 107 and the n⁻-type epitaxial layer 102 so that channel portions are defined at the sidewalls of the U-grooves. After that, a gate oxide film 103 is formed on the inside surface of the groove portion 160 by a thermal oxidation.

Figure 32C:
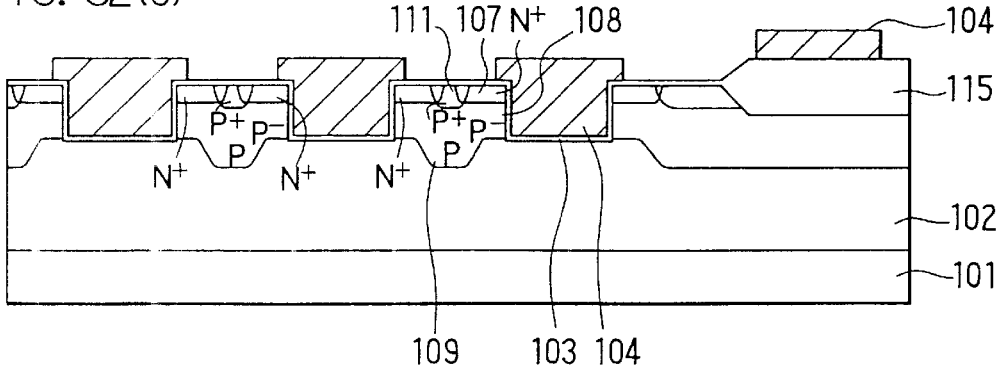

[Step Shown in FIG. 32(c)]

Polysilicon is deposited on the whole area of the wafer 121 including the groove portion 160. Then, the polysilicon is patterned to form a gate electrode 104 through with a photolithography step.

After oxidation of the polysilicon constructing the gate electrode 104, a (not shown) interlayer insulation film 106 made of BPSG, PSG, or the like is deposited. Then, a source electrode 112, a passivation film, a drain electrode 113 are formed to complete to manufacture the vertical power MOSFET 100 as shown in FIGS. 30, 31.

Figure 33:
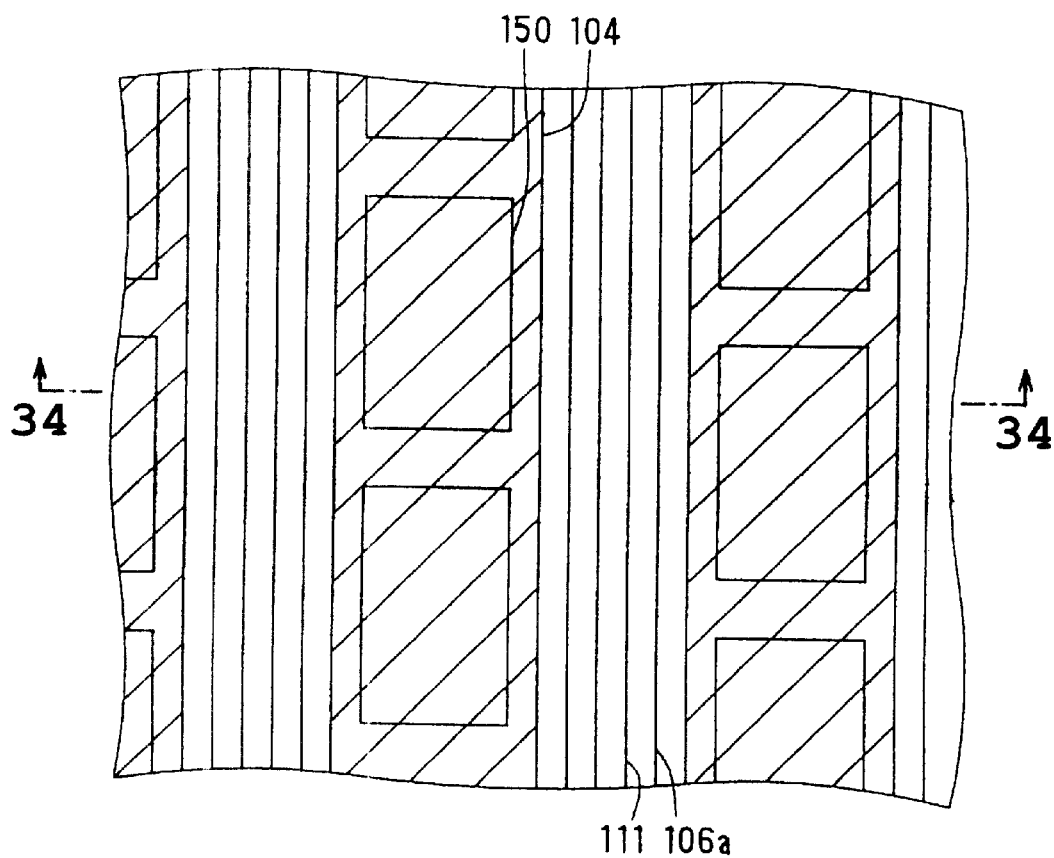
FIG. 33 is a diagram showing a part of a vertical type power MOSFET according to a ninth embodiment of the present invention.
Figure 34:
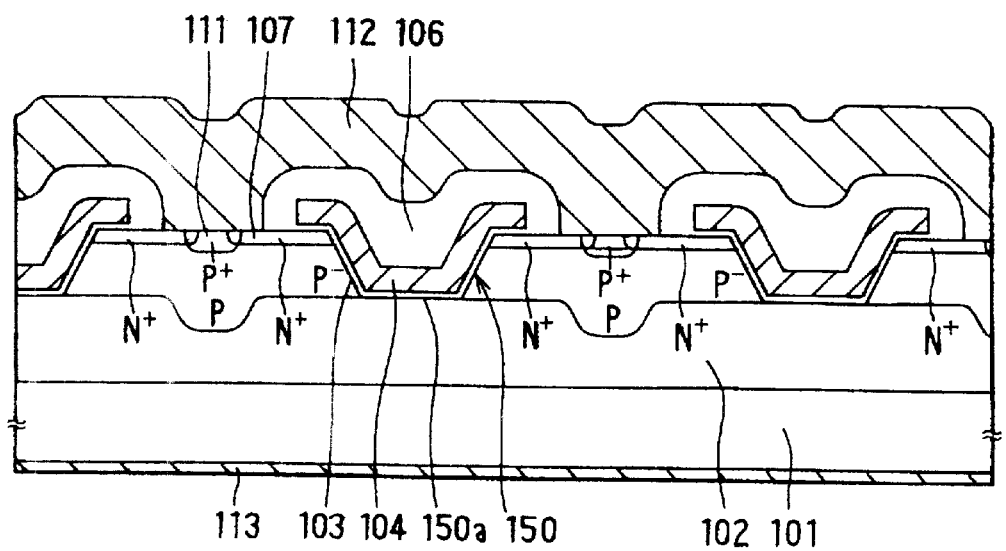
FIG. 34 is a cross-sectional view taken along line 34—34 in FIG. 33.
Figure 35A:
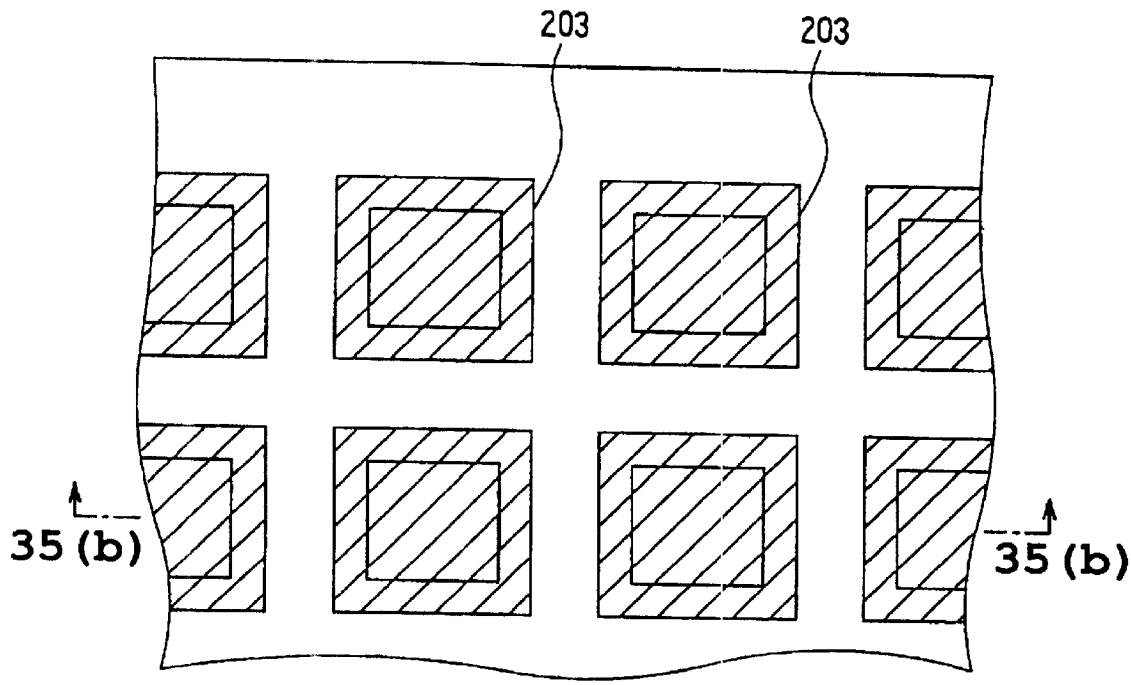
FIG. 35(a) is a diagram showing a part of a conventional vertical type power MOSFET.
Figure 35B:
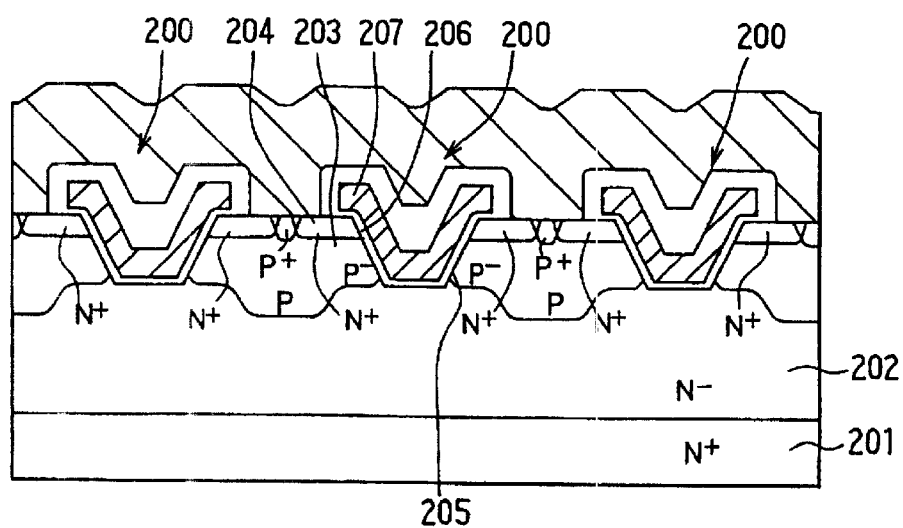
FIG. 35(b) is a cross-sectional view taken along line 35(b)—35(b) in FIG. 35(a).

Next, a concave type vertical power MOSFET according to a ninth embodiment will be explained with reference to FIGS. 33, 34. FIG. 33 is a plan view of the concave type vertical power MOSFET 100 according to the ninth embodiment. FIG. 34 is a cross-sectional view taken along line 34—34 in FIG. 33. This embodiment is substantially the same as the seventh embodiment except for a layout pattern of the unit cell. The corresponding components are put the same numeral to omit its explanation.

The vertical power MOSFET of this embodiment has a layout of which the U-grooves 150 are arranged in plural lines on a plane on the wafer 121, and adjacent U-grooves 150 between adjacent lines are shifted to the arranged direction.

In detail, these U-grooves 150 are arranged to a staggered shape that each U-groove 150 are shifted alternately every adjacent line.

In this way, by shifting the position of the unit cell, a distance between the channel portion of the unit cell to the source electrode 112 and a distance between the channel portion of the unit cell and the p-type contact layer 111 can be uniformed.

Here, the layout pattern of the unit cell can be adopted to the vertical power MOSFET 100 as described in the eighth embodiment in which the channel portion is formed to perpendicular to the main surface of the semiconductor substrate 101.

As described above, in the various embodiments explained, the explanation has been made only for the case in which the present invention is applied to the vertical type power MOSFET which performs the unipolar operation, however, there is no limitation thereto, and the application may be available to a power MOSIC in which such a vertical type power MOSFET is incorporated, and further the application is also possible to a gate structure of an insulation gate type bipolar transistor (IGBT) which performs the bipolar operation.

In addition, the explanation has been made only for the n-channel type in the examples, however, it is needless to say that the same effect can be obtained with respect to the p-channel type in which the type of the semiconductor is exchanged between the n⁻-type and the p-type.

Further, the plane shape of the unit cell is not limited to the above-mentioned square and the equilateral triangle, and alternatively it is possible to optionally select rectangles, hexagons and the like. Incidentally, with respect to the change of the plane pattern, the change can be easily made using the formation pattern of the LOCOS oxide film 165.

INDUSTRIAL APPLICABILITY

As described above, in the vertical type MOSFET according to the present invention, it is unnecessary to form a U-groove having a sufficiently long bottom face taking the positional deviation of the U-groove with respect to the base layer end into account as in the conventional U-MOS device, but the length of the bottom face of the U-groove can be made minimally short. As a result, the unit cell size can be greatly reduced, the ON-resistance per area can be reduced into a degree equivalent to the R-MOS device, and the production yield and thereliability are high in a degree equivalent to the DMOS type device, so that it is extremely effective in adoption as switching devices for electric power and the like as MOSIC in which its elemental article or the device is incorporated.

What is claimed is:

1. A semiconductor device comprising:
   a semiconductor substrate;
   a plurality of vertical MOSFETs formed on the semiconductor substrate, each of the vertical MOSFETs including a base layer formed at a surface portion of the semiconductor substrate with a predetermined depth, and a channel forming layer defined at a sidewall of a groove formed on the surface portion of the semiconductor substrate, where the base layers of the plurality of vertical MOSFETs form a continuous structure; and
   a gate electrode formed to a slit shape, wherein said gate electrode is configured and arranged to cover a plurality of grooves.

2. The semiconductor device according to claim 1, wherein the grooves of the plurality of vertical MOSFETs are arranged in a plurality of lines over the surface portion of the semiconductor substrate.

3. A semiconductor device comprising:
   a semiconductor substrate having a main surface and a back surface opposite to the main surface; and
   a plurality of unit cells formed on the semiconductor substrate, each of the unit cells comprising:
      a semiconductor layer formed at the main surface and having a first conductivity type;
      a base layer formed at a surface portion of the semiconductor layer with a predetermined depth and having a second conductivity type;
      a source layer formed at the surface portion of the semiconductor layer with a depth shallower than the base layer and having the first conductivity type;
      a gate insulation film formed on a channel forming layer defined at a sidewall of a groove portion penetrating the base layer and the source layer;
      a gate electrode formed on the gate insulation film;
      an interlayer insulation film formed on the gate electrode to cover the gate electrode and having a contact hole;
      a source electrode electrically connected to the base layer through the contact hole, where the source layer of a first unit cell contacts the source electrode of the first unit cell along a first region of the surface portion of the semiconductor layer, said first region being between the groove portion of the first unit cell and a second unit cell adjacent to the first unit cell, and the source layer of the first unit cell is separated from the source electrode of the first unit cell along a second region of the surface portion of the semiconductor layer, said second region being between the groove portion of the first unit cell and a third unit cell adjacent to the first unit cell, such that along the second region, the source layer of the first unit cell is separated from the source electrode of the first unit cell by at least the gate electrode of the first unit cell; and
      a drain electrode formed on the back surface of the semiconductor substrate, wherein the base layers of the plurality of unit cells form a continuous structure.

4. A semiconductor device according to claim 1, wherein the groove portions of the plurality of unit cells are dispersed over the main surface of the semiconductor substrate.

5. A semiconductor device according to claim 1, wherein a bottom surface of the groove portion is formed to a rectangular shape in a plane parallel to the main surface of the semiconductor substrate.

6. A semiconductor device according to claim 1, wherein the groove portions of the plurality of unit cells are arranged over the main surface of the semiconductor substrate to form a matrix of rows and columns.

7. A semiconductor device according to claim 1, wherein the groove portions of the plurality of unit cells are arranged in a plurality of lines over the main surface of the semiconductor substrate, and
   wherein groove portions in one of the plurality of lines are shifted with respect to groove portions in an adjacent one of the plurality of lines along a direction of the line.

8. A semiconductor device according to claim 7, wherein groove portions in said one of the plurality of lines are arranged in staggered relation with respect to groove portions in the adjacent one of the plurality of lines.

9. A semiconductor device according to claim 1, wherein the gate electrode is formed to a slit shape to cover a plurality of channels.

10. The semiconductor device according to claim 1, wherein the groove portions of the plurality of unit cells are arranged in a plurality of lines over the main surface of the semiconductor substrate.

11. The semiconductor device according to claim 1, wherein the first and second unit cells are arranged along the surface portion of the semiconductor layer in a first line, and
    wherein the first and third unit cells are arranged along the surface portion of the semiconductor layer in a second line perpendicular to the first line.

12. A semiconductor device comprising:
    a semiconductor substrate having a main surface and a back surface opposite to the main surface;
    a semiconductor layer formed at the main surface and having a first conductivity type;
    a base layer formed at a surface portion of the semiconductor layer with a predetermined depth, having a second conductivity type, and a plurality of groove portions being separated from each other and penetrating the base layer;
    a source layer formed at the surface, portion of the semiconductor layer with a depth shallower than the base layer and having the first conductivity type;
    a gate insulation film formed on a channel forming layer defined at each of the sidewalls of the groove portions;
    a gate electrode formed on the gate insulation film;
    a source electrode electrically connected to the base layer, where the source layer contacts the source electrode along a first region of the surface portion of the semiconductor layer, said first region being between a first groove portion and a second groove portion adjacent to the first groove portion, and the source layer is separate from the source electrode along a second region of the surface portion of the semiconductor layer, said second region being between the first groove portion and a third groove portion adjacent to the first groove portion such that along the second region, the source layer is separated from the source electrode by at least the gate electrode; and
    a drain electrode formed on the back surface of the semiconductor substrate, wherein the base layer is perforated by the groove portions to have a lattice-like pattern.

13. The semiconductor device according to claim 12, wherein the first and second groove portions are arranged along the surface portion of the semiconductor layer in a first line, and
    wherein the first and third groove portions are arranged along the surface portion of the semiconductor layer in a second line perpendicular to the first line.

14. The semiconductor device according to claim 12, wherein the gate electrode is formed to a slit shape to cover a plurality of channels.

15. A semiconductor device comprising:
a semiconductor substrate having a main surface and a back surface opposite to the main surface; and
first and second unit cells formed on the semiconductor substrate, each of the first and second unit cells comprising:
  a semiconductor layer formed at the main surface and having a first conductivity type;
  a base layer formed at a surface portion of the semiconductor layer with a predetermined depth and having a second conductivity type;
  a source layer formed at the surface portion of the semiconductor layer with a depth shallower than the base layer and having the first conductivity type;
  a gate insulation film formed on a channel forming layer defined at a sidewall of a groove portion penetrating the base layer and the source layer;
  a gate electrode formed on the gate insulation film;
  an interlayer insulation film formed on the gate electrode to cover the gate electrode and having a contact hole;
  a source electrode electrically connected to the base layer through the contact hole; and
  a drain electrode formed on the back surface of the semiconductor substrate, wherein the base layer of the first unit cell is contiguous with the base layer of the second unit cell in the semiconductor substrate and the gate electrodes of the first and second unit cells form a continuous electrode structure, and the continuous electrode structure has a slit shape configured and arranged to cover the groove portions of the first and second unit cells.

16. A semiconductor device comprising:
a semiconductor substrate; and
a plurality of vertical MOSFETs formed on the semiconductor substrate, each of the vertical MOSFETs including a base layer formed at a surface portion of the semiconductor substrate with a predetermined depth, and a channel forming layer defined at a sidewall of a groove portion formed on the surface portion of the semiconductor substrate, where the base layers of the plurality of vertical MOSFETs form a continuous structure;
wherein a source layer of a first vertical MOSFET contacts a source electrode of the first vertical MOSFET along a first region of the surface portion of the semiconductor substrate, said first region being between a groove portion of the first vertical MOSFET and a second vertical MOSFET adjacent to the first vertical MOSFET, and
wherein the source layer of the first vertical MOSFET is separated from the source electrode of the first vertical MOSFET along a second region of the surface portion of the semiconductor substrate, said second region being between the groove portion of the first vertical MOSFET and a third vertical MOSFET adjacent to the first vertical MOSFET, such that along the second region the source layer of the first vertical MOSFET is separated from the source electrode of the first vertical MOSFET by at least a gate electrode.

17. The semiconductor device according to claim 16, wherein the first and second vertical MOSFETs are arranged along the surface portion of the semiconductor substrate in a first line, and
wherein the first and third vertical MOSFETs are arranged along the surface portion of the semiconductor substrate in a second line perpendicular to the first line.

18. A semiconductor device comprising:
a semiconductor substrate having a main surface and a back surface opposite to the main surface; and
first and second unit cells formed on the semiconductor substrate, each of the first and second unit cells comprising:
  a semiconductor layer formed at the main surface and having a first conductivity type;
  a base layer formed at a surface portion of the semiconductor layer with a predetermined depth and having a second conductivity type;
  a source layer formed at the surface portion of the semiconductor layer with a depth shallower than the base layer and having the first conductivity type;
  a gate insulation film formed on a channel forming layer defined at a sidewall of a groove portion penetrating the base layer and the source layer;
  a gate electrode formed on the gate insulation film;
  an interlayer insulation film formed on the gate electrode to cover the gate electrode and having a contact hole;
  a source electrode electrically connected to the base layer through the contact hole; and
  a drain electrode formed on the back surface of the semiconductor substrate, wherein the base layer of the first unit cell is contiguous with the base layer of the second unit cell in the semiconductor substrate;
wherein the source layer of the first unit cell contacts the source electrode of the first unit cell along a first region of the surface portion of the semiconductor layer, said first region being between the groove portion of the first unit cell and the second unit cell, and the source layer of the first unit cell is separated from the source electrode of the first unit cell along a second region of the surface portion of the semiconductor layer, said second region being between the groove portion of the first unit cell and a third unit cell adjacent to the first unit cell, such that along the second region, the source layer of the first unit cell is separated from the source electrode of the first unit cell by at least the gate electrode of the first unit cell.

19. The semiconductor device according to claim 18, wherein the first and second unit cells are arranged along the surface portion of the semiconductor layer in a first line, and
wherein the first and third unit cells are arranged along the surface portion of the semiconductor layer in a second line perpendicular to the first line.

20. A semiconductor device comprising:
a substrate; and
a plurality of vertical MOSFETs formed on the substrate, wherein each of the vertical MOSFETs includes a base layer formed at a surface portion of the substrate and having a predetermined depth, and
wherein the base layer of each of the vertical MOSFETs includes a channel portion at a sidewall of a groove portion formed on the surface portion of the substrate, wherein the base layers of the plurality of vertical MOSFETs form a continuous structure;
wherein a source layer of a first vertical MOSFET contacts a source electrode of the first vertical MOSFET along a first region of the surface portion of the substrate, said first region being between a groove portion of the first vertical MOSFET and a second vertical MOSFET adjacent to the first vertical MOSFET, and the source layer of the first vertical MOSFET is separate from the source electrode of the first vertical MOSFET along a second, region of the surface portion of the substrate, said second region being between the groove portion of the first vertical MOSFET and a third vertical MOSFET adjacent to the first vertical MOSFET, such that along the second region, the source layer of the first vertical MOSFET is separated from the source electrode of the first vertical MOSFET by at least a gate electrode.

21. The semiconductor device according to claim 20, wherein the groove portions of the plurality of vertical MOSFETs are arranged in a plurality of lines over a main surface of the substrate.

22. The semiconductor device according to claim 20, wherein the semiconductor device further includes a gate electrode formed to a slit shape, wherein said gate electrode is configured and arranged to cover a plurality of groove portions.

23. The semiconductor device according to claim 20, wherein the first and second vertical MOSFETs are arranged along the surface portion of the substrate in a first line, and wherein the first and third vertical MOSFETs are arranged along the surface portion of the substrate in a second line perpendicular to the first line.

* * * * *